(12) United States Patent
Moriya et al.

(10) Patent No.: US 11,004,749 B2
(45) Date of Patent: May 11, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventors: Taro Moriya, Ibaraki (JP); Hiroshi Yanagigawa, Ibaraki (JP); Kazuhisa Mori, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/573,485

(22) Filed: Sep. 17, 2019

(65) Prior Publication Data

US 2020/0126977 A1    Apr. 23, 2020

(30) Foreign Application Priority Data

Oct. 19, 2018    (JP) ............................. JP2018-197503

(51) Int. Cl.

| | | |
|---|---|---|
| *H01L 21/8234* | (2006.01) | |
| *H01L 27/088* | (2006.01) | |
| *H01L 29/66* | (2006.01) | |
| *H01L 29/10* | (2006.01) | |
| *H01L 29/78* | (2006.01) | |
| *H01L 27/24* | (2006.01) | |
| *H01L 29/423* | (2006.01) | |

(52) U.S. Cl.
CPC ............... *H01L 21/823456* (2013.01); *H01L 21/823487* (2013.01); *H01L 27/088* (2013.01); *H01L 27/2454* (2013.01); *H01L 29/1095* (2013.01); *H01L 29/4236* (2013.01); *H01L 29/42336* (2013.01); *H01L 29/66734* (2013.01); *H01L 29/7813* (2013.01); *H01L 29/7827* (2013.01); *H01L 21/823425* (2013.01)

(58) Field of Classification Search
CPC ............... H01L 27/2454; H01L 27/088; H01L 21/823487; H01L 21/823456; H01L 29/7827; H01L 29/7813; H01L 29/42336; H01L 29/4236; H01L 29/66734
See application file for complete search history.

(56) References Cited

U.S. PATENT DOCUMENTS

| | | | |
|---|---|---|---|
| 7,034,359 B2 | 4/2006 | Harada | |
| 2004/0262677 A1* | 12/2004 | Harada | ............... H01L 29/7813 257/329 |
| 2016/0308529 A1 | 10/2016 | Yanagigawa | |

FOREIGN PATENT DOCUMENTS

| | | |
|---|---|---|
| JP | 2002-368219 A | 12/2002 |
| JP | 2005-019558 A | 1/2005 |
| JP | 2016-207716 A | 12/2016 |

* cited by examiner

*Primary Examiner* — Joseph C. Nicely
(74) *Attorney, Agent, or Firm* — McDermott Will & Emery LLP

(57) ABSTRACT

A semiconductor device for suppressing a variation in characteristics caused by a current flowing at the time of breakdown is disclosed. The first power MOS transistor Q 1 and the column CLM are formed in the first element region FCM defined in the epitaxial layer NEL, and the second power MOS transistor Q 2 is formed in the second element region RCM. The first power MOS transistor Q 1 includes a first trench gate electrode TGE1, and the second power MOS transistor Q 2 includes a second trench gate electrode TGE2. The depth GDP1 of the first trench gate electrode TGE1 is shallower than the depth GDP2 of the second trench gate electrode TGE2.

4 Claims, 30 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2018-197503 filed on Oct. 19, 2018 including the specification, drawings and abstract is incorporated herein by reference in its entirety.

BACKGROUND OF THE INVENTION

The present invention relates to a semiconductor device and a manufacturing method thereof, and the present invention can be suitably applied to, for example, a vehicle-mounted semiconductor device including a power MOS semiconductor device.

For example, it is assumed that the positive electrode and the negative electrode of a power source such as a battery are connected to poles opposite to the original polarity (reverse connection) when maintenance or the like of a vehicle is performed. In order to protect loads and the like when the power supply is reversely connected, a semiconductor device including a power MOS (Metal Oxide Semiconductor) transistor has been applied. As a semiconductor device of this type, for example, a semiconductor device having two power MOS transistors connected in series and having the same characteristics is proposed in Japanese Lead-open Patent Application No. 2002-368219 (Patent Document 1).

However, when two power MOS transistors having the same characteristics are connected in series, on-resistance of the semiconductor device becomes about twice the on-resistance of one power MOS transistor. For this reason, in order to reduce the on-resistance of the semiconductor device, a semiconductor device in which two power MOS transistors having different characteristics and the like are connected in series is proposed in Japanese Lead-open Patent Application No. 2016-207716 (Patent Document 2).

One of the two power MOS transistors is designed so that the maximum rating of the power supply as the withstand voltage is ensured for protection when the power supply is reversely connected. The other of the two power MOS transistors adopts a super junction structure with columns in order to reduce the on-resistance in case of that the power supply is properly connected, such a structure is proposed in Japanese Lead-open Patent Application No. 2005-19558 (Patent Document 3).

SUMMARY OF THE INVENTION

In semiconductor device, breakdown may occur when a voltage exceeding a withstand voltage is applied in an off-state, for example, due to a back electromotive force or a surging current. When breakdown occurs, in the power MOS transistor having the super junction structure, a current flows from the drain side to the source side.

At this time, depending on the arrangement structure of the trench gate electrode and the column, a current may flow from the drain to the source side via the trench gate side. When a current flows through the trench gate side, the gate capacitance fluctuates, and the characteristics of the power MOS transistor fluctuates in some cases.

Other objects and novel features will become apparent from the description of this specification and the accompanying drawings.

A semiconductor device according to an embodiment includes a semiconductor substrate, a semiconducting layer, a first region and a second region, a first switching element, and a second switching element. The first switching element includes a first trench gate electrode located over a first depth from the surface of the semiconductor layer, a first portion of a first impurity region, a first portion of a second impurity region, and a columnar body. The second switching element includes a second trench gate electrode located over a second depth from the surface of the semiconductor layer, a first impurity region second portion, and a second impurity region second portion. The first depth is shallower than the second depth.

A method of manufacturing the semiconductor device according to another embodiment comprises the following steps. Semiconductor layers are formed on the semiconductor substrate. A first region and a second region are defined, respectively. A first trench is formed in the semiconductor layer. A second trench is formed in the semiconductor layer. A columnar body is formed. A first trench gate electrode and a second trench gate electrode are formed. A first impurity region first portion and a first impurity region second portion are formed. A first portion of the second impurity region and a second portion of the second impurity region are formed. In the step of forming the first trench and the step of forming the second trench, the first trench is formed shallower than the second trench. In the step of forming the first trench gate electrode and the step of forming the second trench gate electrode, the first trench gate electrode is formed from the surface of the semiconductor layer to a position shallower than the bottom of the second trench gate electrode.

According to the semiconductor device of the embodiment, it is possible to suppress the first switching element from causing a change in the characteristics of the first switching element when a breakdown occurs.

According to the manufacturing method of the semiconductor device according to another embodiment, it is possible to produce a semiconductor device capable of suppressing the first switching device from causing a change in characteristics when a breakdown occurs.

DETAILED DESCRIPTION OF THE EMBODIMENTS

Figure 1:
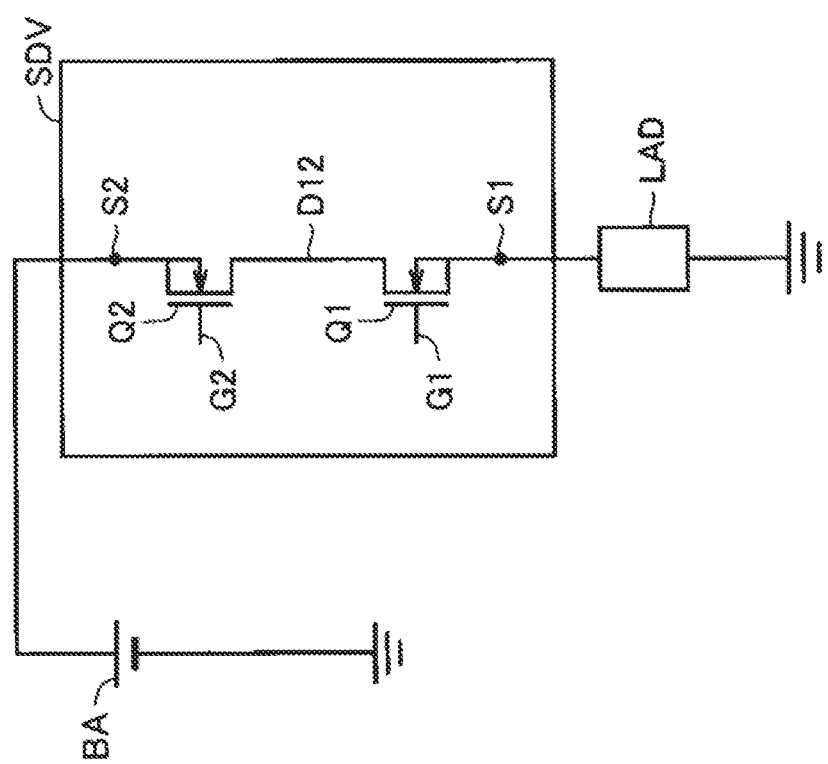
FIG. 1 is a circuit diagram to which a semiconductor device according to each embodiment is applied.

First, circuits to which the semiconductor device according to the respective embodiments is applied as switches will be described. As shown in FIG. 1, semiconductor device SDVs are electrically connected between a power supply BA such as a battery and the loads LAD. In the semiconductor device SDV, the first power MOS transistor Q 1 (first switching element) and the second power MOS transistor Q 2 (second switching element) are electrically connected in series via the common drain D 12.

In a state where the power supply BA is appropriately connected, the positive electrode of the power supply BA is electrically connected to the source S 2 of the second power MOS transistor Q 2, and the negative electrode of the power supply BA is electrically connected to the source S 1 of the first power MOS transistor Q 1 via the load LAD.

The first power MOS transistor Q 1 is a power MOS transistor that performs normal operation (on and off operation) to provide power to the load LAD when the power supply BA is properly connected. In the first power MOS transistor Q 1, a withstand voltage in consideration of a voltage due to a back electromotive force, a surge current, or the like is secured. On the other hand, the second power MOS transistor Q 2 is a power MOS transistor for preventing reverse current flow when the power supply BA is reversely connected. Hereinafter, the structures of the semiconductor device will be described in detail.

Figure 2:
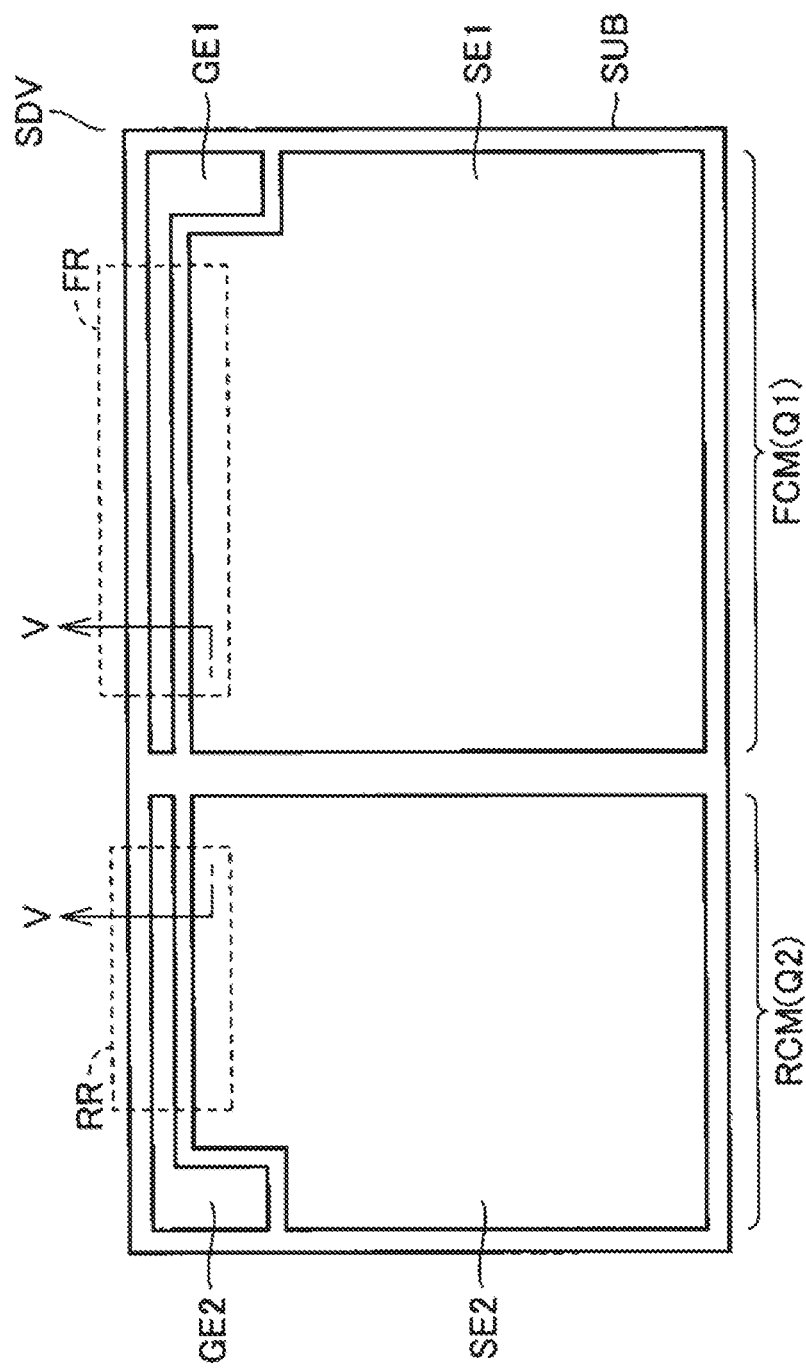
FIG. 2 is a plan view showing an example of a planar pattern of a semiconductor device according to a first embodiment.

An exemplary semiconductor device according to first embodiment first embodiment will be described. As shown in FIG. 2, in the semiconductor device SDV, the first power MOS transistor Q 1 and the second power MOS transistor Q 2 are formed in the same semiconductor substrate SUB. The first power MOS transistor Q 1 is formed in the first element region FCM. The second power MOS transistor Q 2 is formed in the second element region RCM. The semiconductor substrate SUBs are commonly drained DNs, see FIG. 5.

A first outer peripheral structure TS1 (see FIG. 5) is formed to surround the first device region FCM from the periphery of the first device region FCM and prevent current leakage. A second peripheral structure TS2 (see FIG. 5) is formed to surround the second device region RCM from the periphery of the second device region RCM and prevent current leakage. The semiconductor substrate SUBs are mounted on lead frames, for example.

Figure 3:
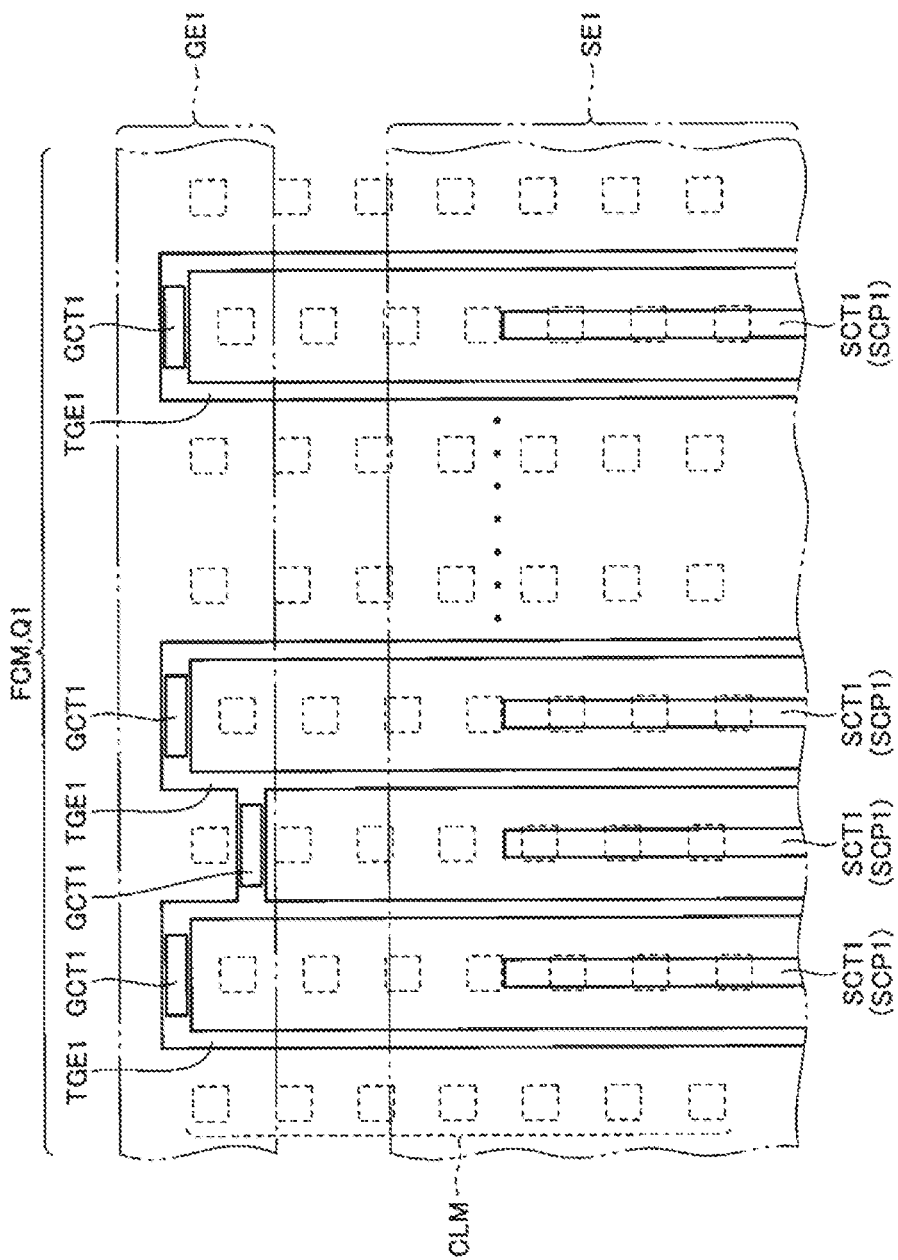
FIG. 3 is a portion enlarged plan view showing a planar structure in a dotted line frame FR shown in FIG. 2.

The first gate electrode GE1 and the first source electrode SE1 are disposed on the surfaces of the first device regions FCMs. As shown in FIGS. 2 and 3, the first gate electrode GE1 is electrically connected to the first trench gate electrode TGE1 serving as the gate of the first power-MOS transistor Q 1 via the gate contact GCT1. The first source electrodes SE1 are electrically connected to the source of the first power MOS transistor Q 1 via the source contacts SCT1. In the first element region FCM, P-type columns CLM are formed at intervals from each other.

Figure 4:
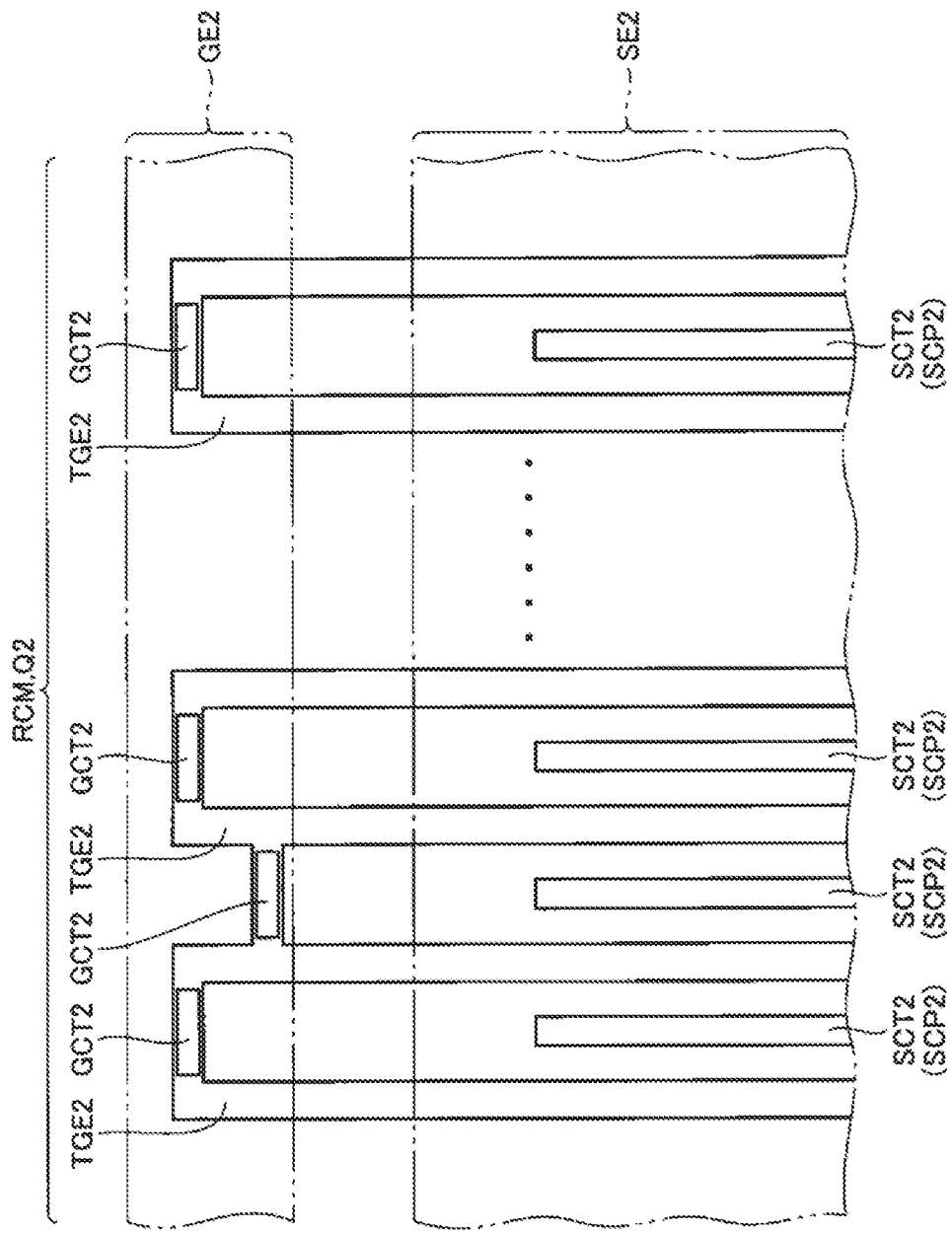
FIG. 4 is a portion enlarged plan view showing a planar structure within the dotted line frame RR shown in FIG. 2.

A second gate electrode GE2 and a second source electrode SE2 are disposed on the second element region RCM. As shown in FIGS. 2 and 4, the second gate electrode GE2 is electrically connected to the second trench gate electrode TGE2 serving as the gate of the second power MOS transistor Q 2 via the gate contact GCT2. The second source electrodes SE2 are electrically connected to the source of the second power MOS transistor Q 2 via the source contacts SCT2.

Figure 5:
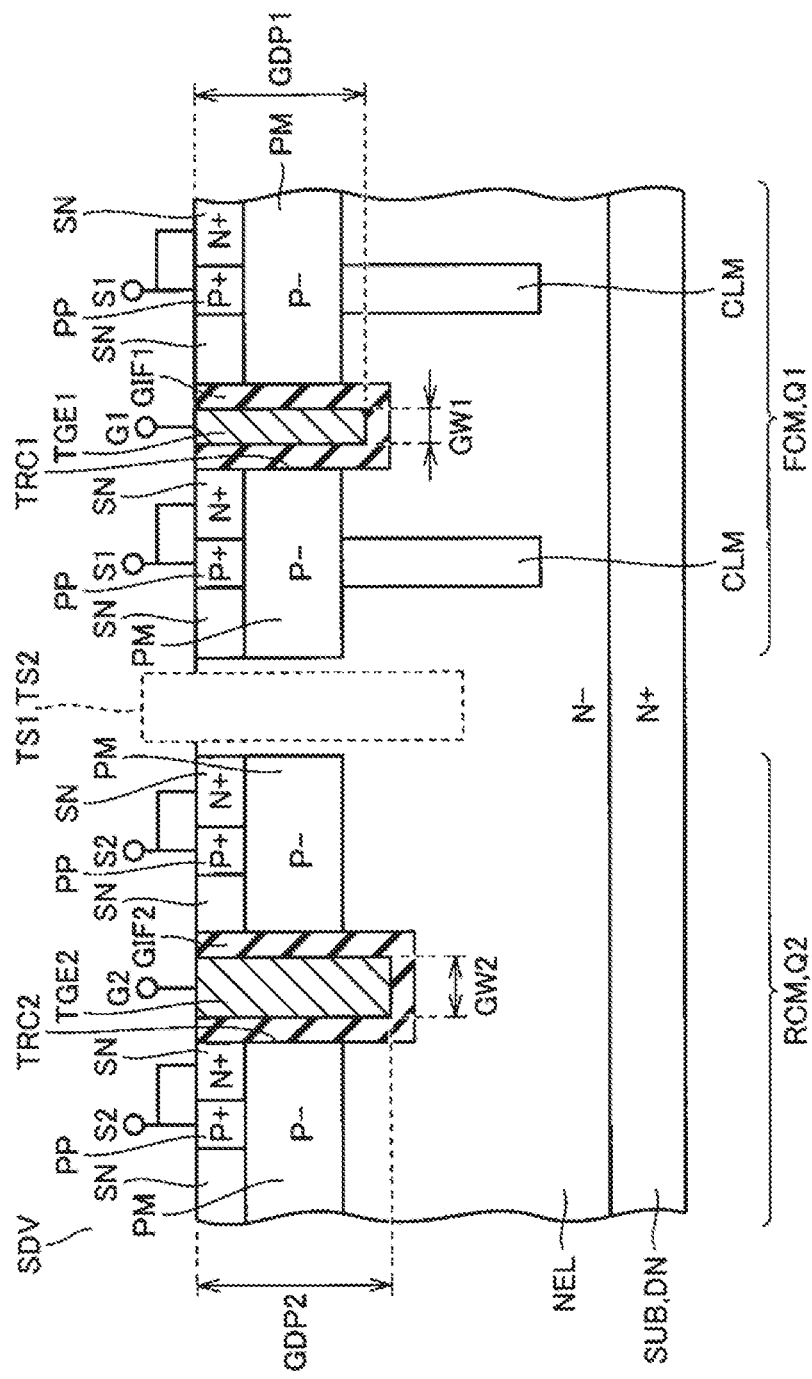
FIG. 5 is a portion cross-sectional view in the cross-sectional line V-V shown in FIG. 2.

Next, cross-sectional structures of the semiconductor device SDVs will be described. As shown in FIG. 5, N−-type epitaxial layers NELs are formed on the surfaces of N+-type semiconductor substrate SUBs. The N+-type semiconductor substrate SUB serves as a common drain DN of the first power MOS transistor Q 1 and a common drain DN of the second power MOS transistor Q 2. In the epitaxial layer NEL, a first element region FCM and a second element region RCM are defined at a distance from each other. The first outer peripheral portion structure TS1 and the second outer peripheral portion structure TS2 are located between the first element region FCM and the second element region RCM.

In the first device region FCM, a first trench TRC1 is formed at a predetermined depth from the surface of the epitaxial layer NEL. First trench gate electrodes TGE1 are formed in the first trench TRC1 with a first gate dielectric film GIF1 interposed therebetween. As shown in FIG. 3, the first trench gate electrodes TGE1 extend in one direction and are formed to be spaced apart from each other in another direction intersecting with one direction.

In the epitaxial layer NEL, P--type P--type regions PM serving as channels are formed in a region shallower than the bottoms of the first trench gate electrodes TGE1 in the epitaxial layer NEL in such a manner that the P--type P--type regions PM are in contact with the first gate dielectric film GIF1. An N+-type N+-type region SN as a source and a P+-type region PP are formed in a region shallower than the P--type region PM in the epitaxial layer NEL. The N+-type region SN is formed so as to be in contact with the P--type region PM and the first gate dielectric film GIF1. The P+-type region PP is formed so as to be in contact with the P--type region PM and the N+-type region SN.

In a region deeper than the P--type region PM in the epitaxial layer NEL, a P-type column CLM is formed at a position deeper than the bottom of the first trench gate electrodes TGE1 in a manner in which the epitaxial layer NEL is in contact with the P--type region PM. As shown in FIG. 3, the columns CLMs are spaced apart from each other along directions in which the first trench gate electrodes TGE1 extend. The column CLM is arranged at a distance from the first trench gate electrode TGE1 in another direction intersecting the direction in which the first trench gate electrode TGE1 extends.

In the second device area RCM, a second trench TRC2 is formed at a predetermined depth from the surface of the epitaxial layer NEL. A second trench gate electrode TGE2 is formed in the second trench TRC2 with a second gate dielectric film GIF2 (second insulating film) interposed therebetween. As shown in FIG. 3, the second trench gate electrodes TGE2 extend in one direction and are formed to be spaced apart from each other in another direction intersecting with one direction.

In the epitaxial layer NEL, P--type P--type regions PM serving as channels are formed in a region shallower than the bottoms of the second trench gate electrodes TGE2 in the epitaxial layer NEL in such a manner that the P--type P--type regions PM are in contact with the second gate dielectric film GIF2. An N+-type N+-type region SN as a source and a P+-type region PP are formed in a region shallower than the P--type region PM in the epitaxial layer NEL. The N+-type region SN is formed so as to be in contact with the P--type region PM and the second gate dielectric film GIF2. The P+-type region PP is formed so as to be in contact with the P--type region PM and the N+-type region SN.

In the semiconductor device SDVs described above, the first trench gate electrodes TGE1 of the first power MOS transistors Q 1 are located at a predetermined depth GDP1 from the surfaces of the epitaxial layers NELs. The second trench gate electrodes TGE2 of the second power MOS transistors Q 2 extend from the surfaces of the epitaxial layers NEL to a predetermined depth GDP2 (second depth). The depth GDP1 is shallower than the depth GDP2. The length (width GW1) in the direction crossing the direction in which the first trench gate electrode TGE1 extends is narrower than the length (width GW2) in the direction crossing the direction in which the second trench gate electrode TGE2 extends.

Figure 6:
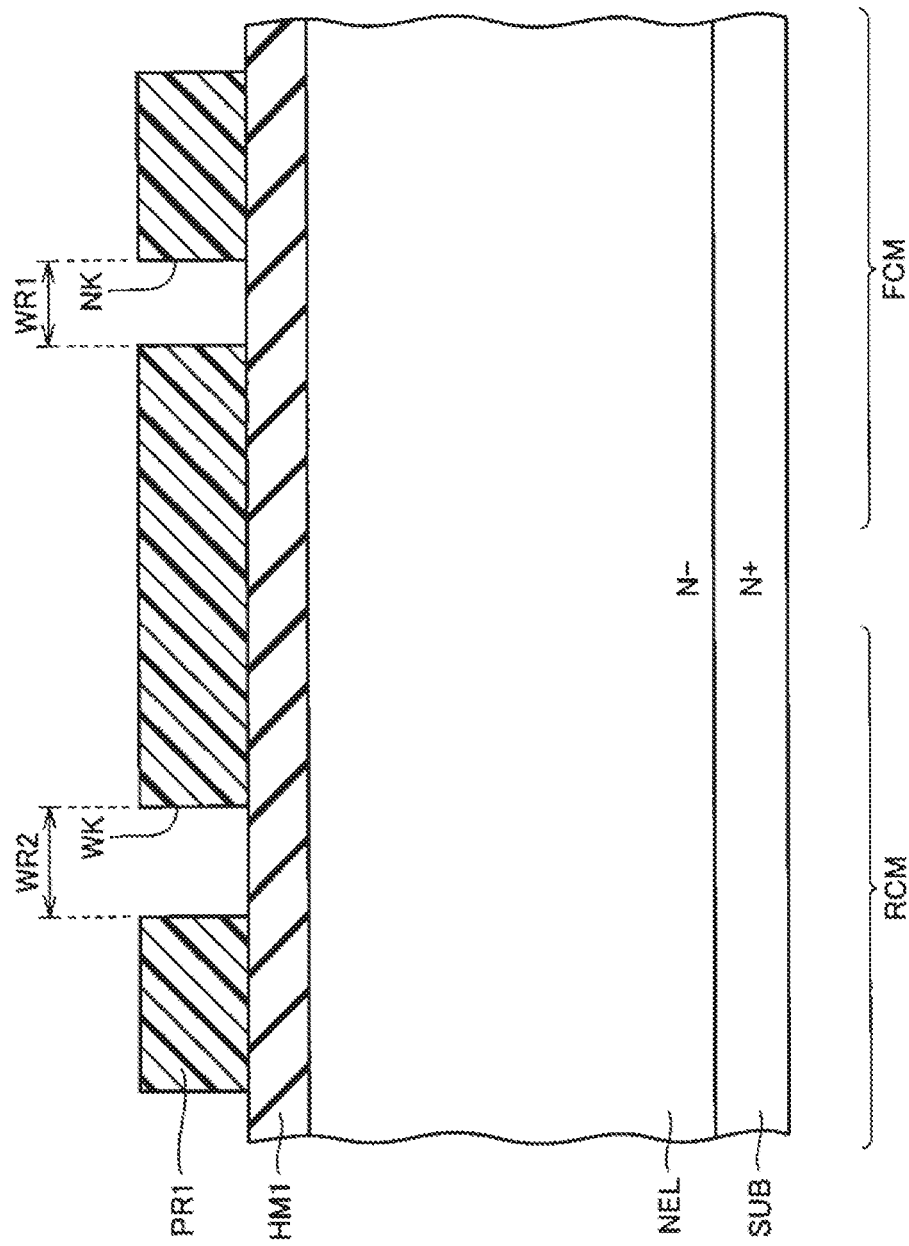
FIG. 6 is a partial cross-sectional view illustrating one step of a method of manufacturing a semiconductor device according to the first embodiment.

Next, an exemplary manufacturing method of the above-described semiconductor device will be described. First, N+-type semiconductor substrate SUBs serving as drain regions are prepared as shown in FIG. 6. Next, as shown in FIG. 6, N--type epitaxial layers NELs are formed on the surfaces of the semiconductor substrate SUBs by epitaxial growth. Next, a silicon oxide film HM1 serving as a hard mask is formed so as to cover the epitaxial layers NELs.

Next, a predetermined photolithography process is performed to form a photo resist pattern PR1. An opening NK corresponding to the first trench and an opening WK corresponding to the second trench are formed in the photoresist pattern PR1. The opening width of the opening portion NK is the width WR1, and the opening width of the opening portion WK is the width WR2. The width WR1 is narrower than the width WR2.

Next, anisotropic etching is performed on the HM1 of the silicon oxide film using the photoresist pattern PR1 as an etching mask to form openings NPs in the first device regions FCMs. An opening WP is formed in the second element region RCM. Thereafter, the photoresist pattern PR1 is removed.

Figure 7:
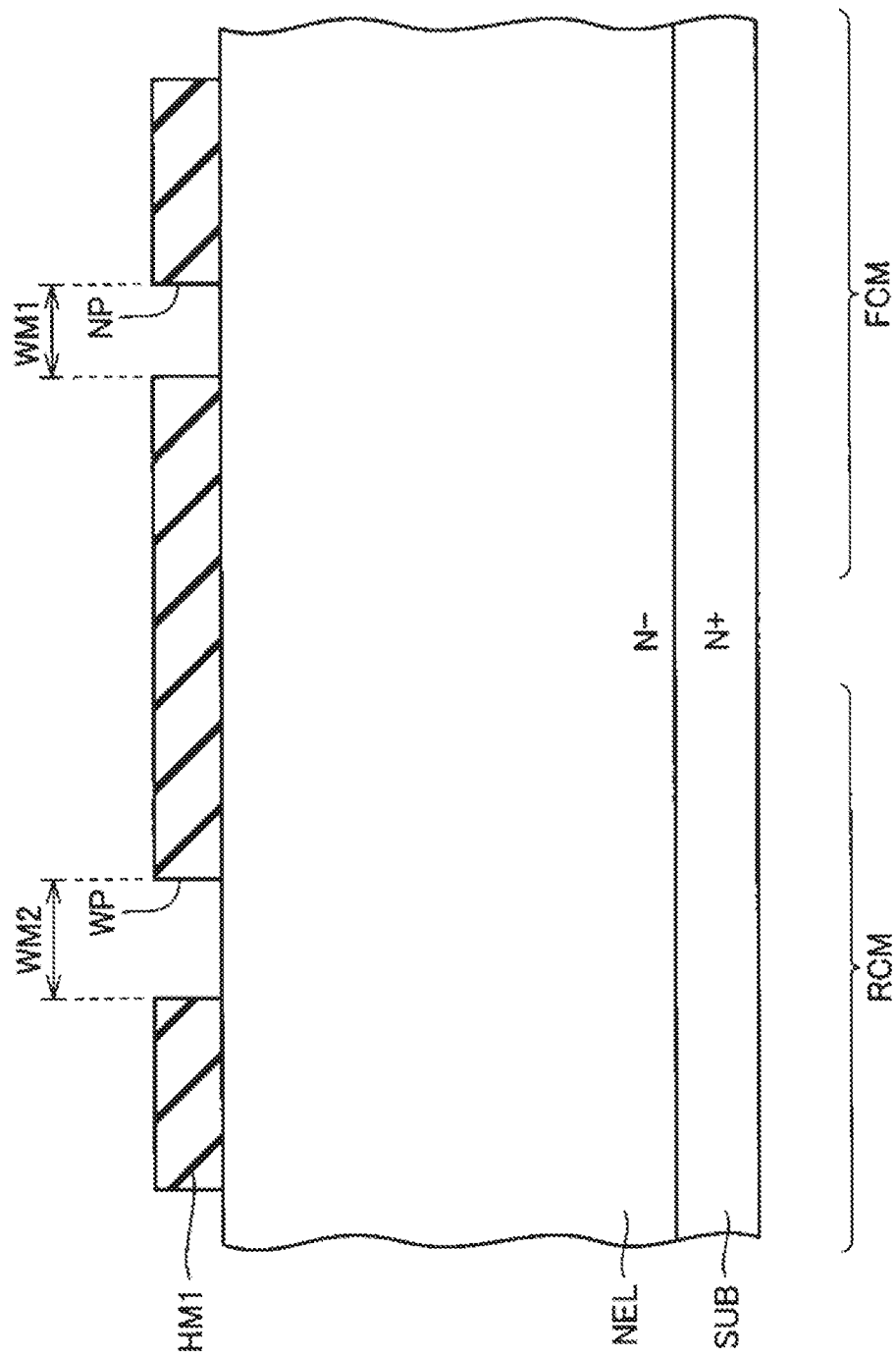
FIG. 7 is a partial cross-sectional view illustrating a step performed after the step shown in FIG. 6.

Thus, as shown in FIG. 7, patterns of the silicon oxide film HM1 serving as a hard mask when the first trench and the second trench are formed are formed. Openings NPs for forming the first trenches NPs are formed in portions of the silicon oxide film HM1 located in the first device regions FCMs. An opening WP for forming a second trench is formed in a part of the silicon oxide film HM1 located in the second device area RCM. The opening width of the opening portion NP is the width WM1, and the opening width of the opening portion WP is the width WM2. The width WM1 is narrower than the width WM2.

Figure 8:
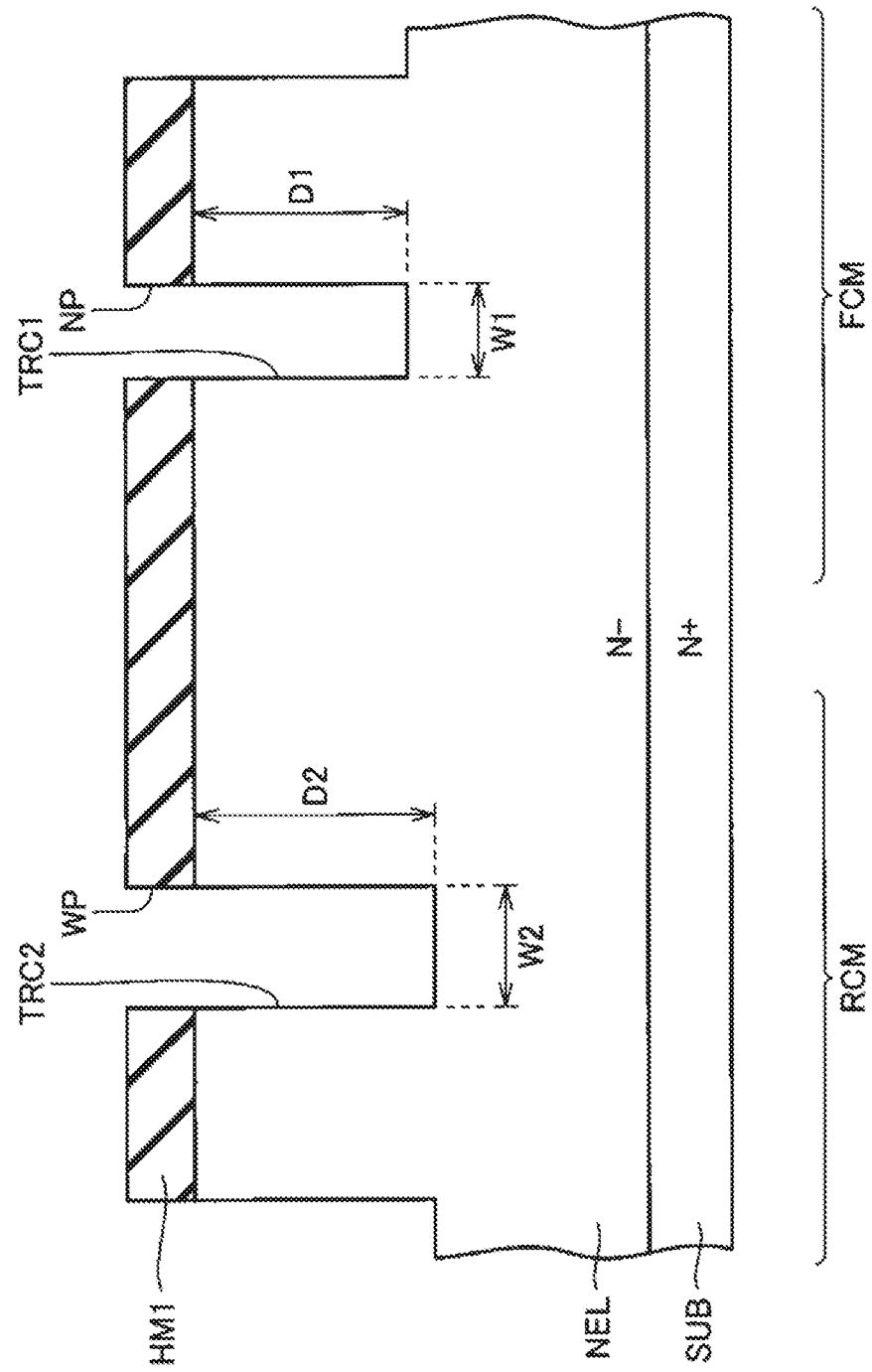
FIG. 8 is a partial cross-sectional view illustrating a step performed after the step shown in FIG. 7.

Next, as shown in FIG. 8, a first trench TRC1 is formed in the first element region FCM and a second trench TRC2 is formed in the second element region RCM by performing an etching process on the epitaxial layer NEL using the silicon oxide film HM1 as an etching mask.

Here, the width WM1 of the opening NP for forming the first trench is narrower than the width WM2 of the opening WP for forming the second trench. Therefore, due to the micro-loading effect, the etching grade of the epitaxial layer NEL at the time of forming the first trench becomes lower than the etching grade of the epitaxial layer NEL at the time of forming the second trench. The micro-loading effect is reported, for example, in Patent Document 3.

As a result, the depth D 1 of the first trench TRC1 becomes shallower than the depth D 2 of the second trench TRC2. The width W 1 of the first trench TRC1 is narrower than the width W 2 of the second trench TRC2. Thereafter, the silicon oxide film HM1 is removed.

Next, a silicon oxide film IM (see FIG. 9) serving as an implantation mask is formed so as to cover the semiconductor substrate SUBs (epitaxial layers NELs). Next, a photoresist pattern (not shown) is formed by performing a predetermined photolithography process. Openings corresponding to the columns are formed in the photoresist pattern. Next, the silicon oxide film IM (see FIG. 9) is etched using the photoresist pattern as an etching mask. An opening CK is formed in the silicon oxide film IM. The photoresist pattern is then removed.

Figure 9:
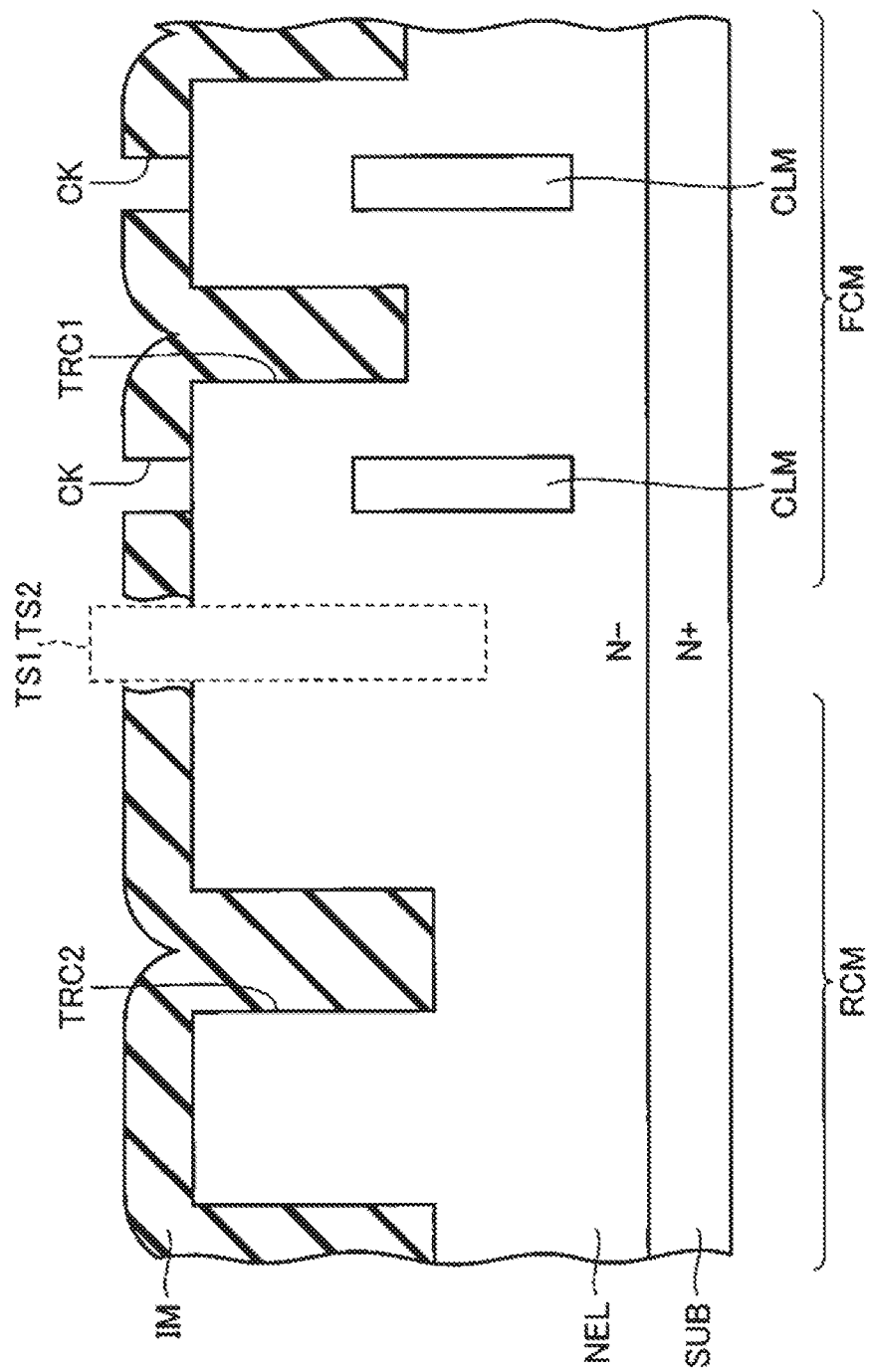
FIG. 9 is a partial cross-sectional view illustrating a step performed after the step shown in FIG. 8.

Next, as shown in FIG. 9, a P-type column CLM is formed in the first element region FCM by implanting a P-type impurity using the silicon oxide film IM in which the opening CK is formed as an implantation mask. Thereafter, the silicon oxide film IM is removed.

Next, a silicon oxide film (not shown) to be a gate dielectric film is formed on the surface of the epitaxial layer NEL including the inner wall surface of the first trench TRC1 and the inner wall surface of the second trench TRC2 by performing, for example, a thermal oxidation process on the surface of the epitaxial layer NEL. Next, in a mode of filling the first trench TRC1 and the second trench TRC2, for example, a polysilicon film (not shown) serving as trench gate electrodes is formed so as to cover the silicon oxide film.

Figure 10:
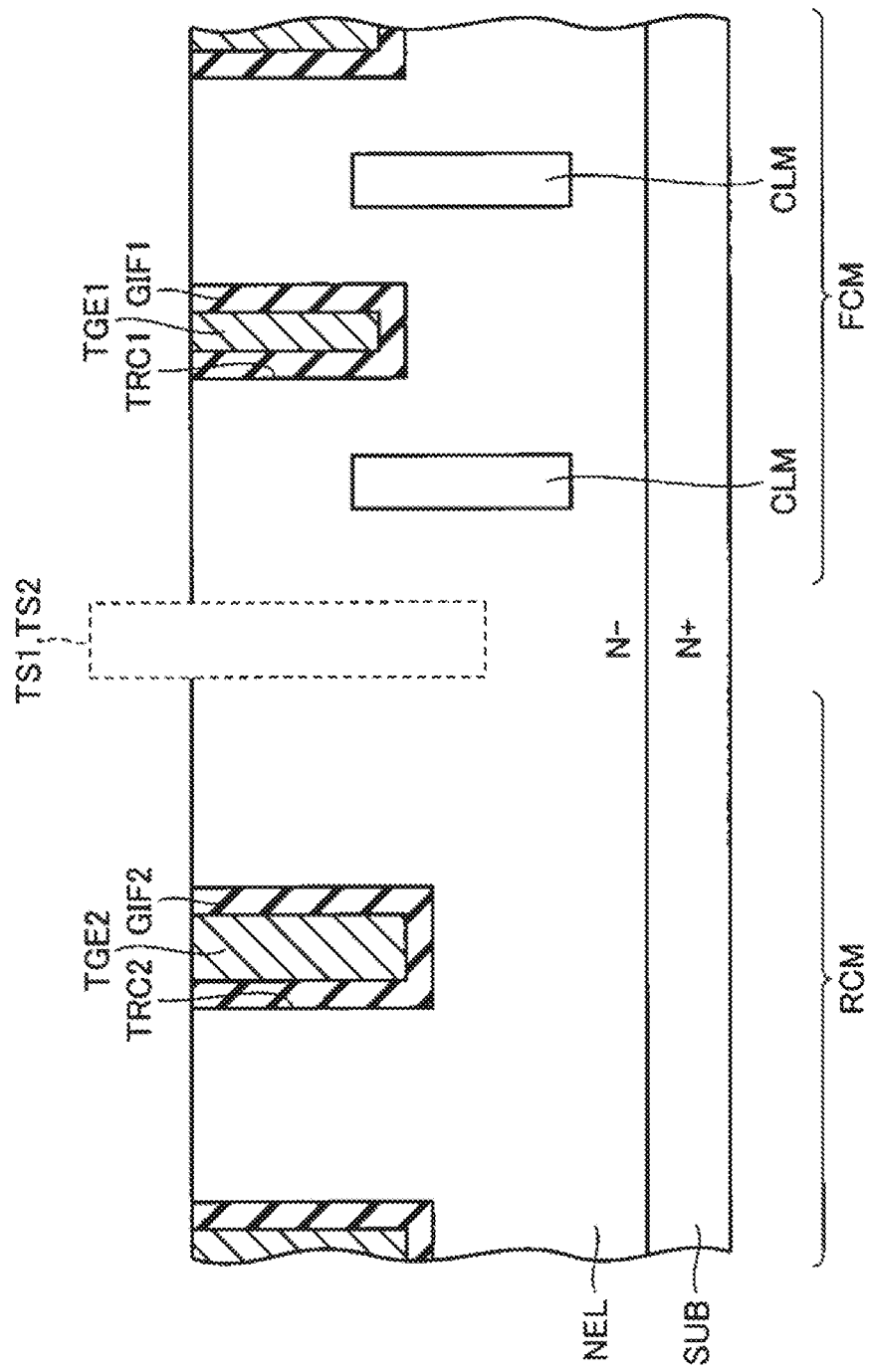
FIG. 10 is a partial cross-sectional view illustrating a step performed after the step shown in FIG. 9.

Next, an etch back treatment is performed on the polysilicon film and the silicon oxide film. As a result, as shown in FIG. 10, the parts of the polysilicon film and the silicon oxide film located on the upper surface of the epitaxial layer NEL are removed, leaving the portions of the polysilicon film and the silicon oxide film located inside the first trench TRC1 and the second trench TRC2, respectively.

In this manner, in the first device area FCM, the first trench gate electrodes TGE1 are formed on the inner wall surface of the first trench TRC1 with the first gate dielectric film GIF1 interposed therebetween. In the second device area RCM, the second trench gate electrodes TGE2 are formed on the inner wall surface of the second trench TRC2 with the second gate dielectric film GIF2 interposed therebetween.

Next, a predetermined photolithography process is performed to form a photoresist pattern (not shown) for forming a P−−-type region. Next, a P−−-type region PM is formed by implanting a P-type impurity using the photoresist pattern as an implantation mask (see FIG. 11). The photoresist pattern is then removed.

Figure 11:
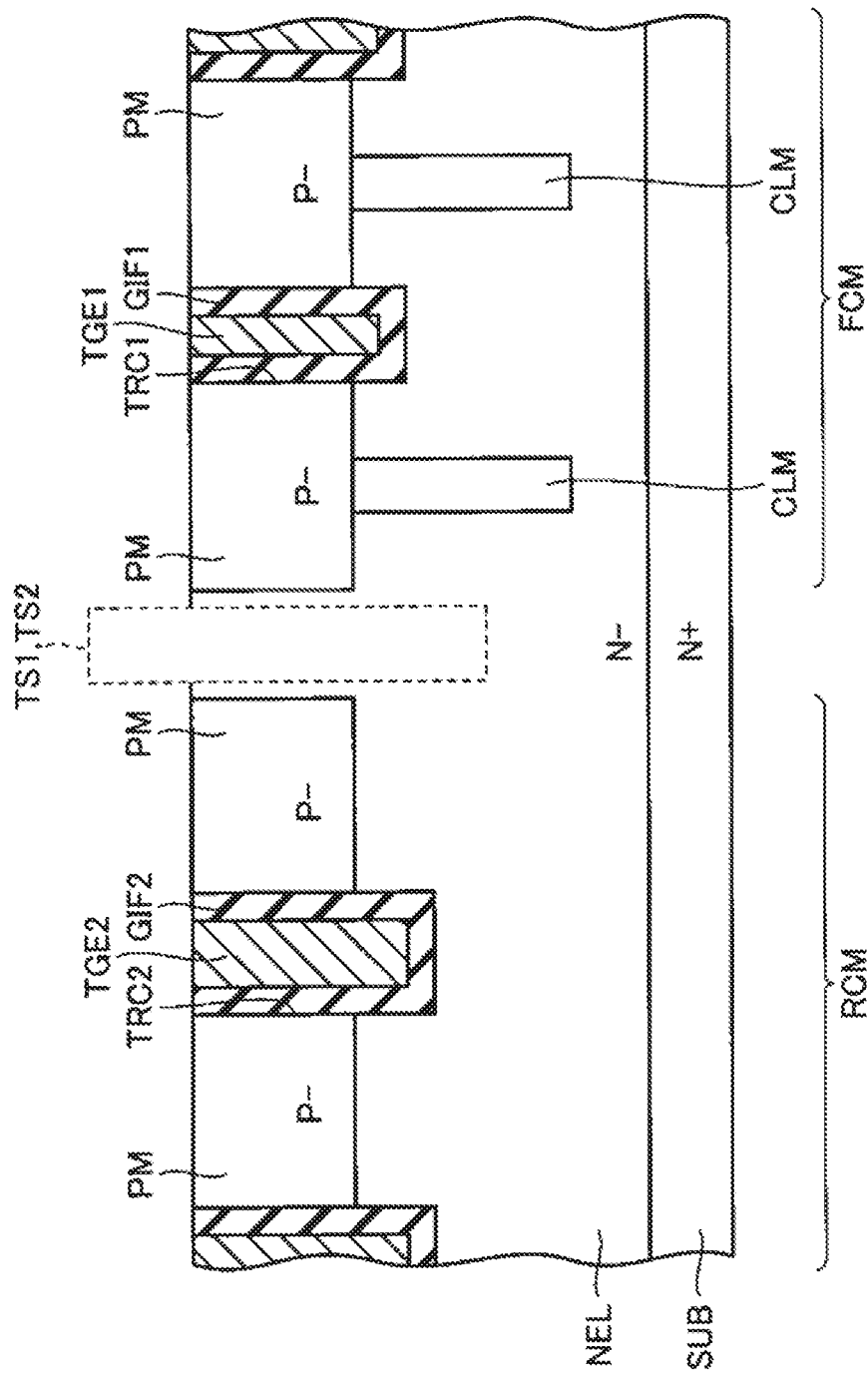
FIG. 11 is a partial cross-sectional view illustrating a step performed after the step shown in FIG. 10.

As a result, as shown in FIG. 11, the P−−-type region PM is formed over a predetermined depth from the surface of the epitaxial layer NEL. In the first element region FCM, the P−−-type region PM is formed from the surface of the epitaxial layer NEL to a position in contact with the column CLM. The bottoms of the P−−-type regions PM are shallower than the bottoms of the first trench gate electrodes TGE1. In the second device region RCM, the bottom of the P−−-type region PM is shallower than the bottom of the second trench gate electrodes TGE2.

Figure 12:
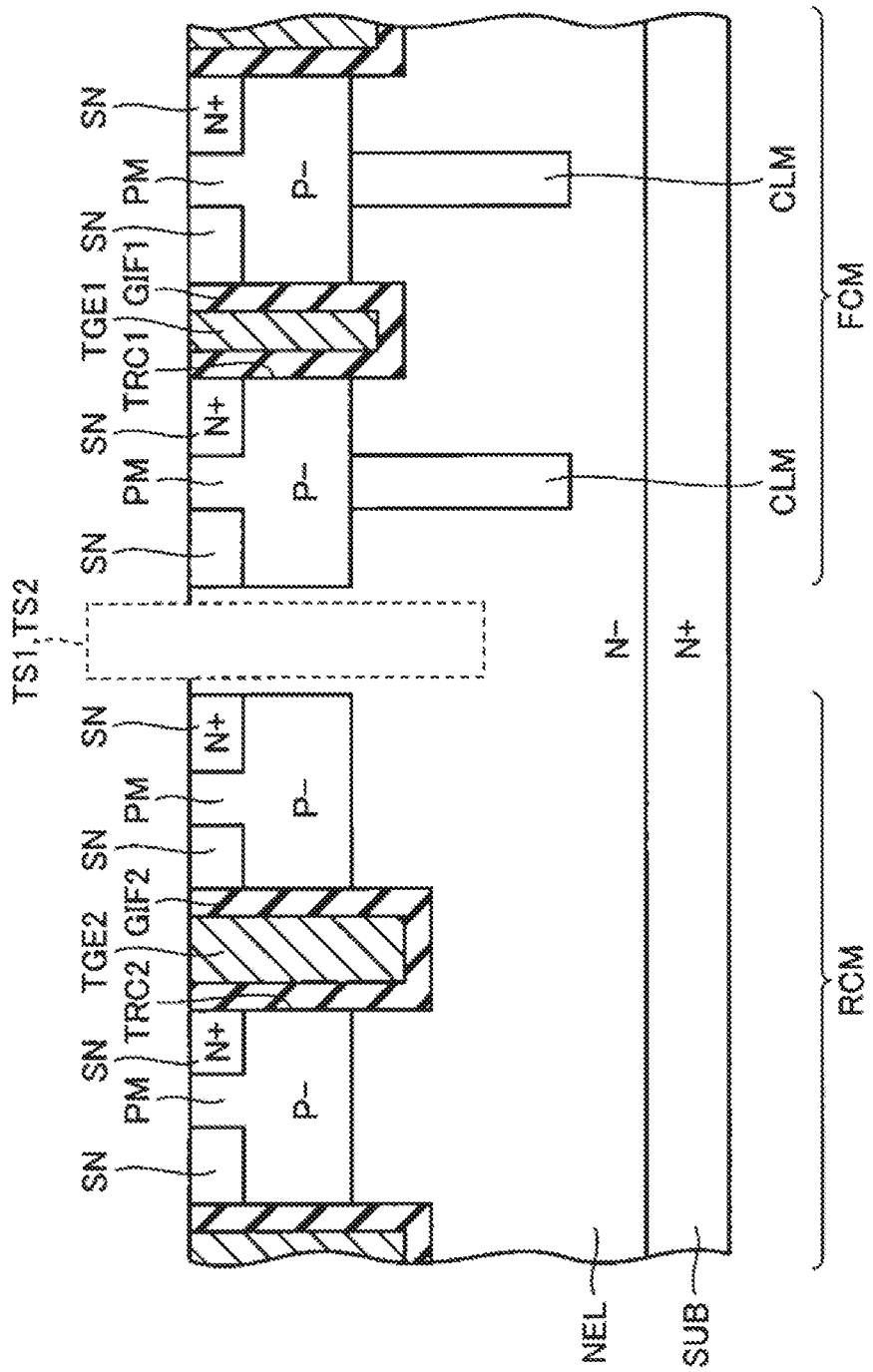
FIG. 12 is a partial cross-sectional view illustrating a step performed after the step shown in FIG. 11.

Next, a predetermined photolithography process is performed to form a photoresist pattern (not shown) for forming an N+-type region. Next, an N+-type region SN is formed by implanting an N-type impurity using the photoresist pattern as an implantation mask, as shown in FIG. 12. The photoresist pattern is then removed.

As a result, as shown in FIG. 12, the N+-type region SN is formed from the surface of the epitaxial layer NEL (P−−-type region PM) to a position shallower than the bottom of the P−−-type region PM. In the first device region FCM, the N+-type region SN contacts the first gate dielectric film GIF1 and the P−−-type region PM. In the second device region RCM, the N+-type region SN contacts the second gate dielectric film GIF2 and the P−−-type region PM.

Next, a predetermined photolithography process is performed to form a photoresist pattern (not shown) for forming a P+-type region. Next, a P+-type region PP is formed by implanting a P-type impurity using the photoresist pattern as an implantation mask. The photoresist pattern is then removed.

Figure 13:
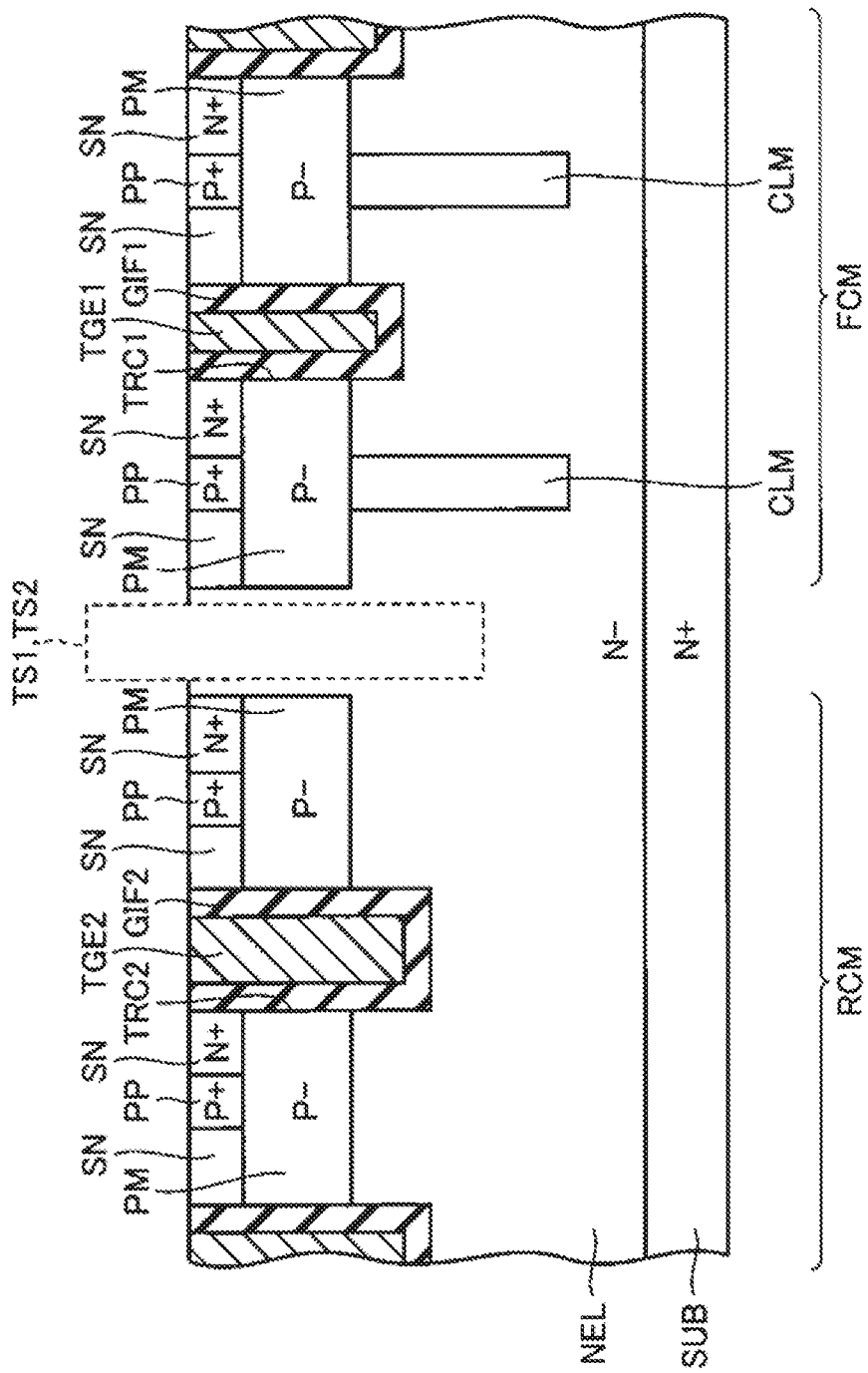
FIG. 13 is a partial cross-sectional view illustrating a step performed after the step shown in FIG. 12.

As a result, as shown in FIG. 13, the P+-type region PP is formed from the surface of the epitaxial layer NEL (P−−-type region PM) to a position shallower than the bottom of the P−−-type region PM. In each of the first element region FCM and the second element region RCM, the P+-type region PP contacts the N+-type region SN and the P−−-type region PM.

Next, an interlayer insulating film ILF is formed so as to cover the first trench gate electrode TGE1, the second trench gate electrode TGE2, and the like. Next, a predetermined photolithography process is performed to form a photoresist pattern (not shown) for forming contact plugs. Next, using the photoresist pattern as an etching mask, contact holes PK (see FIG. 14) are formed in the first element region FCM and the second element region RCM, respectively. The N+-type region SN and the P+-type region PP are exposed at the bottom of the contact hole PK.

Next, a conductive film (not shown) is formed so as to cover the interlayer insulating film ILF in a manner of filling the contact hole PK. Next, the conductive film is subjected to, for example, a chemical mechanical polishing process or an etching back process to remove a portion of the conductive film located on the upper surface of the interlayer insulating film ILF while leaving a portion of the conductive film located in the contact hole PK.

Figure 14:
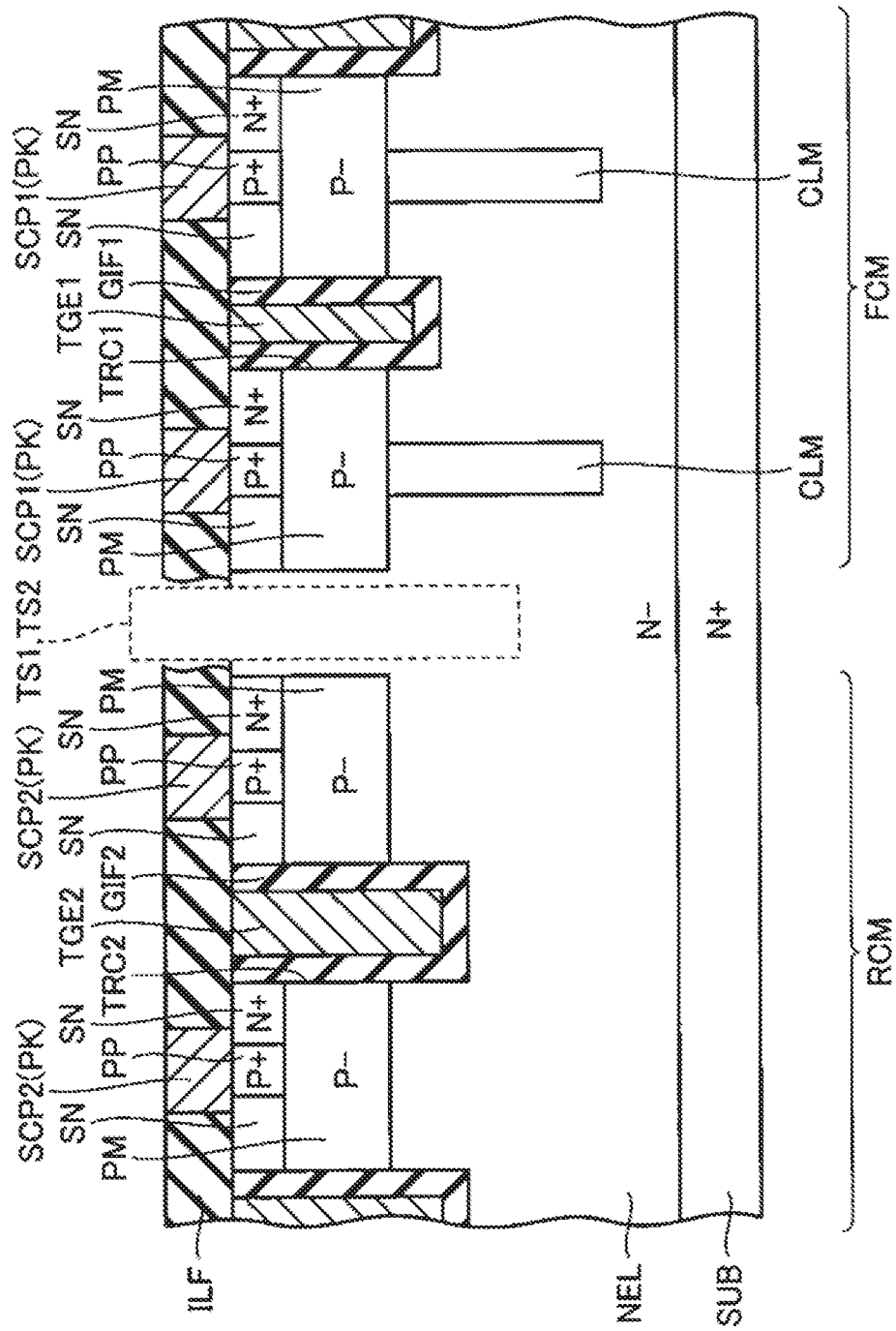
FIG. 14 is a partial cross-sectional view illustrating a step performed after the step shown in FIG. 13.

As a result, as shown in FIG. 14, contact plugs SCP1 are formed in the contact holes PK in the first device regions FCM. The contact plugs SCP1 contact the N+-type region SN and the P+-type region PP. In the second device regions RCM, contact plugs SCP2 are formed in the contact holes RCM. The contact plugs SCP2 contact the N+-type region SN and the P+-type region PP.

Figure 15:
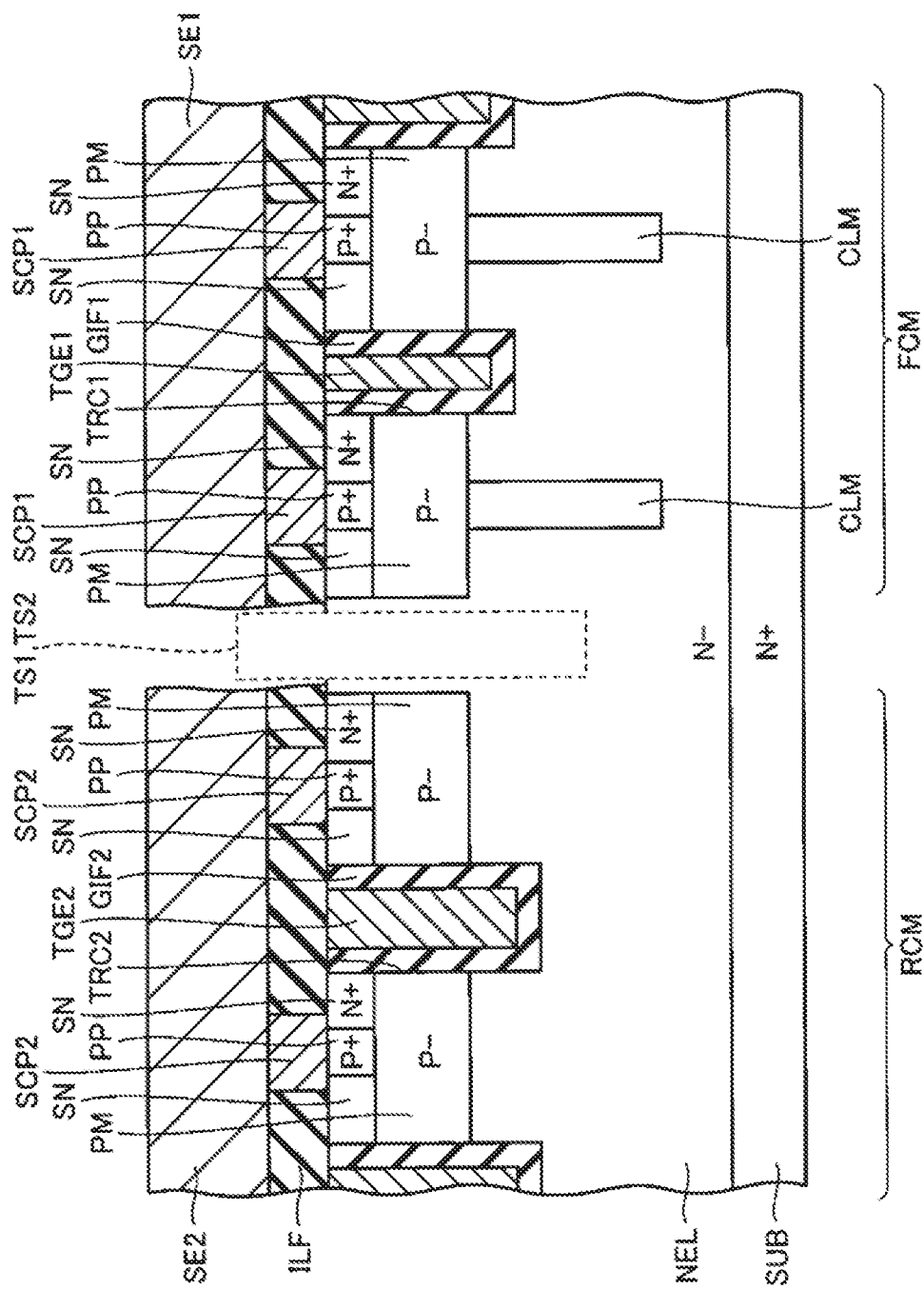
FIG. 15 is a partial cross-sectional view illustrating a step performed after the step shown in FIG. 14.

Next, an aluminum film (not shown) is formed by, e.g., sputtering so as to cover the interlayer insulating film ILF and the like. Next, a photoresist pattern (not shown) is formed by performing a predetermined photolithography process. Next, the aluminum film is etched using the photoresist pattern as an etching mask. The photoresist pattern is then As a result, as shown in FIG. 15, in the first device region FCM, the first source electrode SE1 and the first gate electrode GE1 (see FIG. 3) are formed in the first device region FCM. As shown in FIGS. 15 and 3, the first source electrodes SE1 are electrically connected to the N+-type regions SN and the P+-type regions PP, respectively, via contact plugs SCP1 (source contacts SCT1). The first gate electrode GE1 is electrically connected to the first trench gate electrode TGE1 via the gate contact GCT1.

In the second device region RCM, a second source electrode SE2 and a second gate electrode GE2 (see FIG. 4) are formed in the second device region RCM. As shown in FIGS. 15 and 4, the second source electrodes SE2 are electrically connected to the N+-type regions SN and the P+-type regions PP, respectively, via contact plugs SCP2 (source contacts SCT2). The second gate electrode GE2 is electrically connected to the second trench gate electrode TGE2 via the gate contact GCT2.

Next, a polyimide film (not shown) serving as a cover film is formed so as to cover the first source electrode SE1, the first gate electrode GE1, the second source electrode SE2, the second gate electrode GE2, and the like. Next, a photoresist pattern (not shown) is formed by performing a predetermined photolithography process. Next, the polyimide film is etched using the photoresist pattern as an etching mask. The photoresist pattern is then removed.

Figure 16:
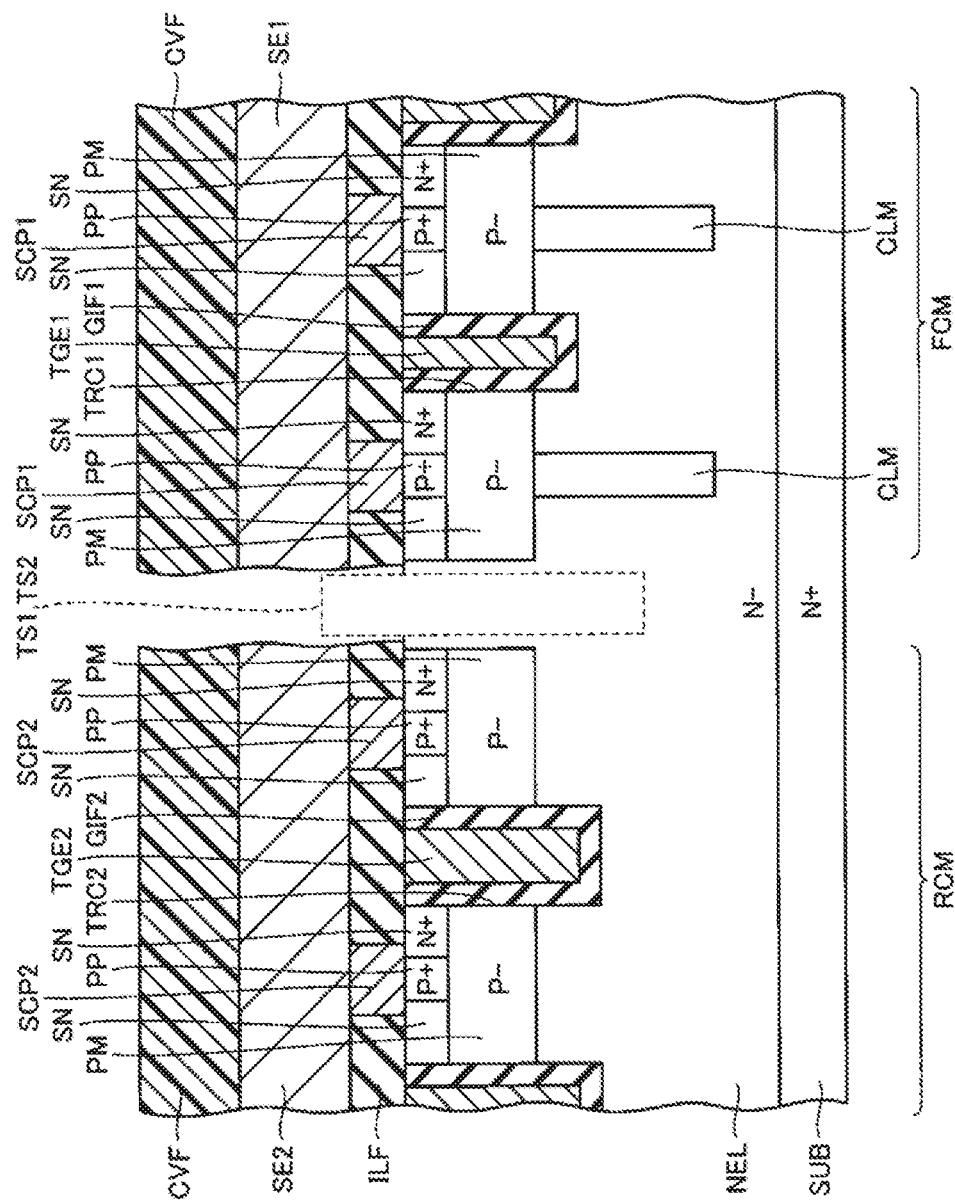
FIG. 16 is a partial cross-sectional view illustrating a step performed after the step shown in FIG. 15.

As a result, as shown in FIG. 16, the cover film CVF is formed. An electrode opening (not shown) exposing each of the first source electrode SE1, the first gate electrode GE1, the second source electrode SE2, and the second gate electrode GE is formed in the cover film CVF.

Thereafter, by dicing the semiconductor substrate SUB (wafer), as shown in FIG. 2, the semiconductor device (semiconductor substrate SUB) in which the first power MOS transistor Q 1 and the second power MOS transistor Q 2 are formed is taken out as one chip. The extracted semiconductor substrate SUB is completed as a semiconductor device through a process of mounting the SUB on a lead frame, not shown, or the like.

Next, the operation of the above-described semiconductor device will be described. First, a case where the power supply BA is appropriately connected will be described with reference to FIG. 1. In this case, by applying a voltage equal to or higher than the threshold voltage to the gate G 1 of the first power MOS transistor Q 1 and the gate G 2 of the second power MOS transistor Q 2, respectively, the first power MOS transistor Q 1 and the second power MOS transistor Q 2 are turned on. As a result, a current flow from the power supply BA through the second power MOS transistor Q 2 to the first power MOS transistor Q 1, and power is supplied to the load LAD.

Figure 17:
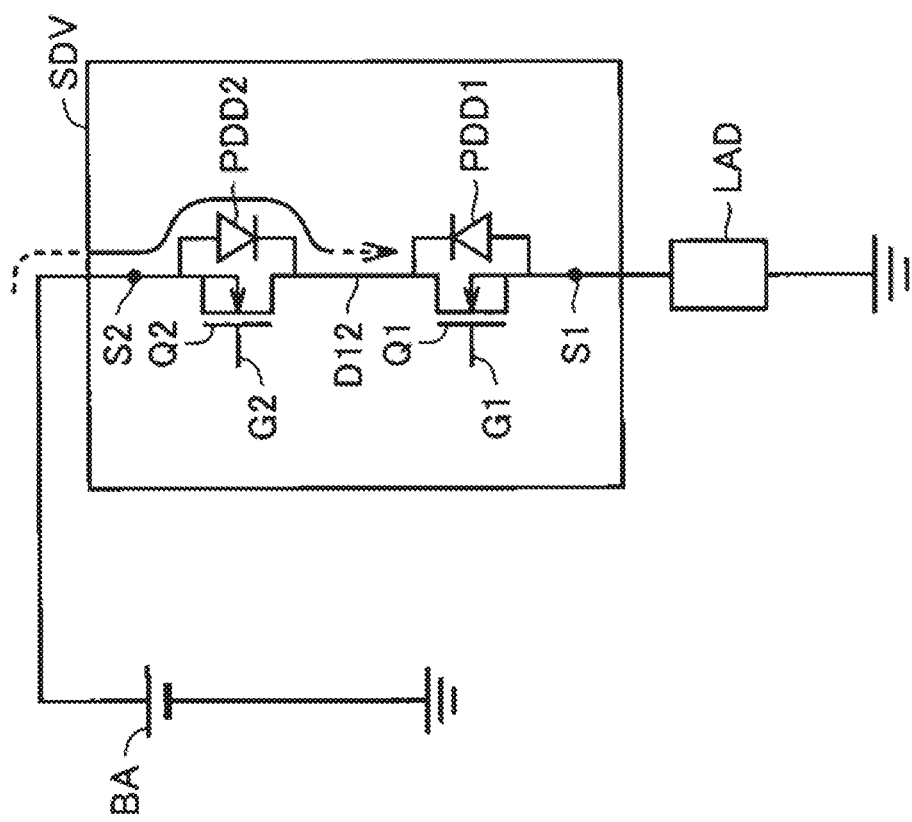
FIG. 17 is a circuit diagram for explaining the operation of a semiconductor device in case of that a power supply is properly connected.

Next, the first power MOS transistor Q 1 is turned off by electrically shorting the gate G 1 to the source S 1. Here, as shown in FIG. 17, a current flow through the parasitic diodes PDD2 regardless of the states of the second power-MOS transistors Q 2, and the potentials of the shared drains D 12 rise. At this time, the withstand voltage is held by the first power MOS transistor Q 1, and it is possible to prevent a current from flowing through the circuit.

Figure 18:
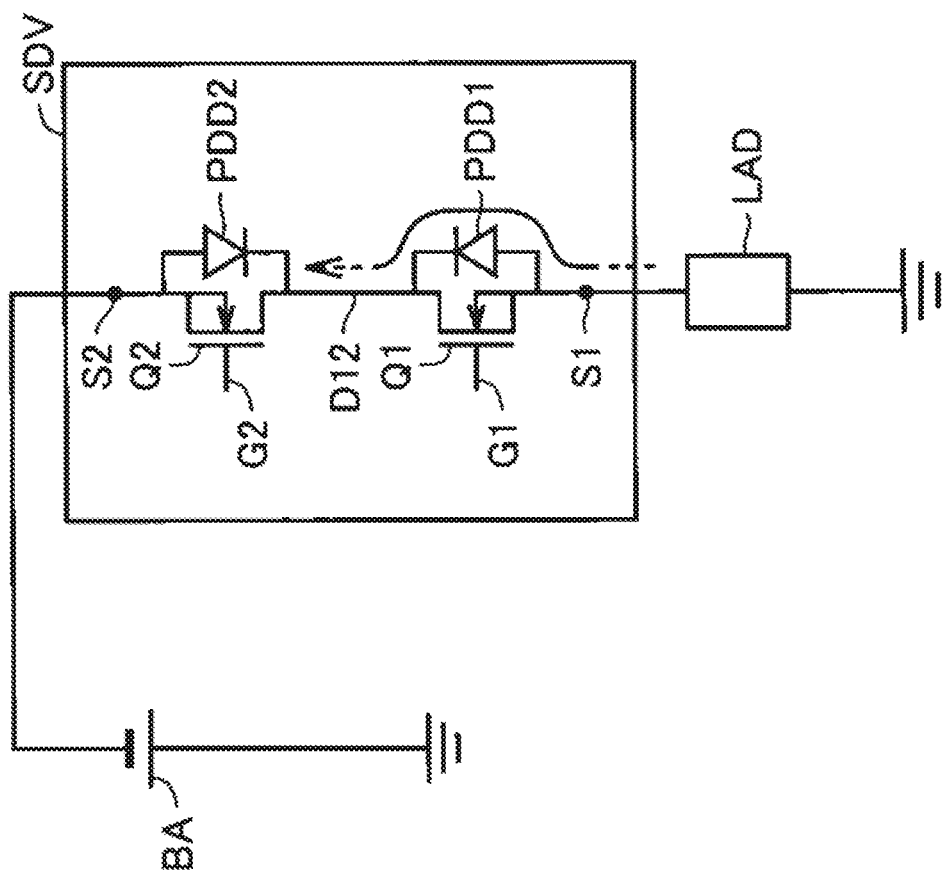
FIG. 18 is a circuit diagram for explaining the operation of a semiconductor device in case of that a power source is inversely connected.

Next, a case where the power supply BA is reversely connected will be described. In this case, the second power MOS transistor Q 2 is turned off. Here, as shown in FIG. 18, a current flow through the parasitic diodes PDD1 regardless of the states of the first power-MOS transistors Q 1, and the potentials of the shared drains D 12 rise. At this time, the withstand voltage is held by the second power MOS transistor Q 2, and it is possible to prevent a current from flowing through the circuit.

Thus, in the semiconductor device SDV described above, in the off-state, current can be prevented from flowing through the circuits both when the power supply BA is properly connected to the semiconductor device SDV and when the power supply BA is reversely connected to the semiconductor device SDV.

Further, in the semiconductor device SDV described above, even if the first power MOS transistor Q 1 breaks down in the off-state when the power supply BA is appropriately connected, the variation of the characteristics of the first power MOS transistor Q 1 can be suppressed. This will be explained in comparison with the semiconductor device according to the comparative examples.

Figure 19:
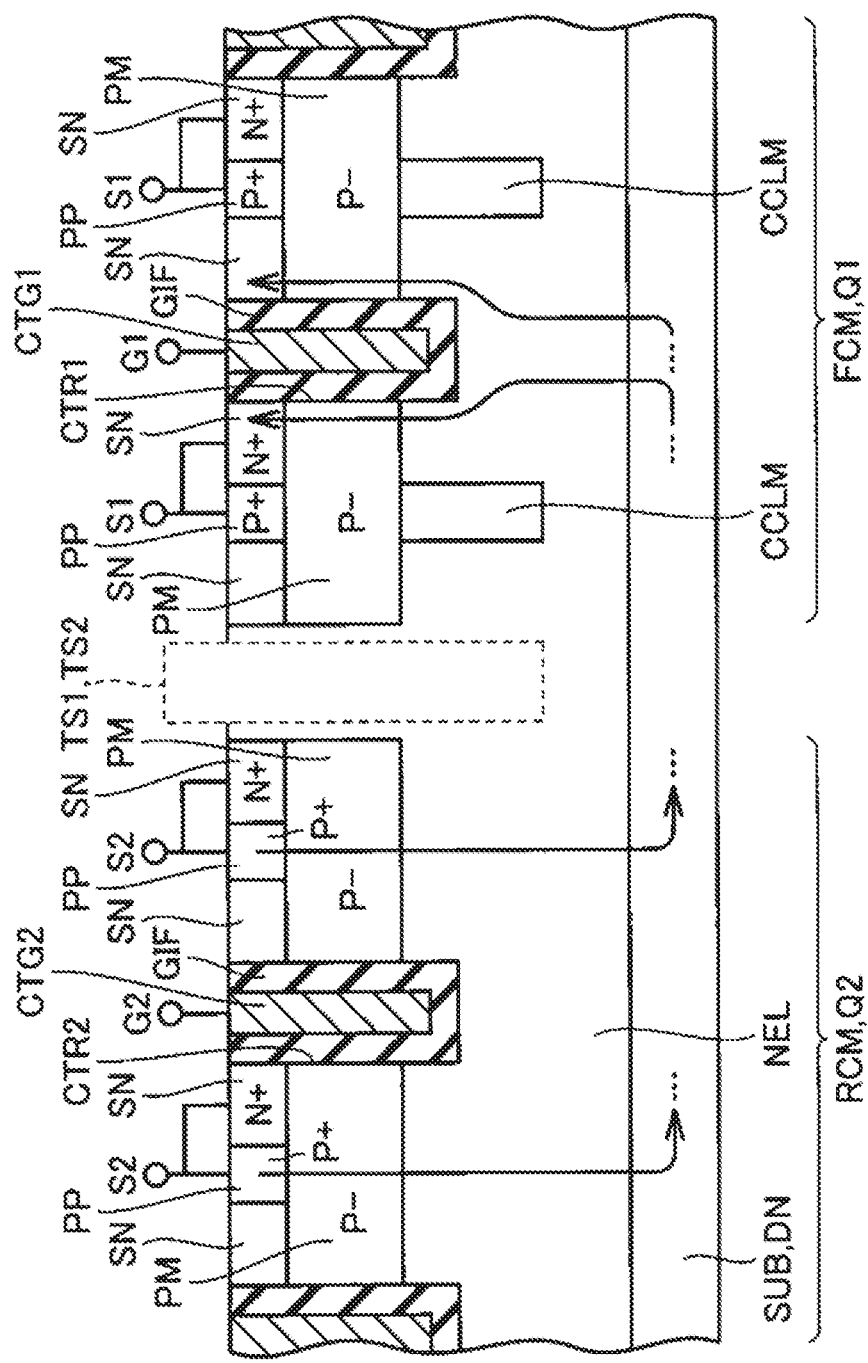
FIG. 19 is a portion cross-sectional view for explaining a semiconductor device according to comparative examples.

As shown in FIG. 19, in the semiconductor device according to the comparative embodiment, the first power MOS transistor Q 1 is arranged in the first element region FCM, and the second power MOS transistor Q 2 is arranged in the second element region RCM.

In the first device region FCM, first trench gate electrodes CTG1 are formed in first trenches CTR1 formed to a predetermined depth from the surfaces of the epitaxial layers NEL with first gate dielectric film GIFs interposed therebetween. In a manner in contact with the P–-type region PM, a P-type column CCLM is formed from the P–-type region PM toward the semiconductor substrate SUB. In the second device regions RCM, second trench gate electrodes CTG2 are formed in second trenches CTR2 formed to a predetermined depth from the surfaces of the epitaxial layers NELs with a second gate dielectric film GIF2 interposed therebetween.

The first trench CTR1 and the second trench CTR2 have substantially the same depth, and the first trench gate electrode CTG1 and the second trench gate electrode CTG2 are located at substantially the same depth from the surfaces of the epitaxial layers NELs. The same reference numerals are assigned to the same components as those of the semiconductor device related to first embodiment, and descriptions thereof will not be repeated unless required.

As shown in FIG. 19, in the semiconductor device according to the comparative embodiment, when the first power MOS transistor Q 1 breaks down, a current may flow from the semiconductor substrate SUBs serving as the common drains to the side of the first trench gate electrodes CTG1. When a current is concentrated and flows toward the first trench gate electrodes CTG1 due to breakdown of the first power MOS transistor Q 1, the gate capacitance fluctuates (increases) and the characteristics of the first power MOS transistor Q 1 fluctuate.

Figure 20:
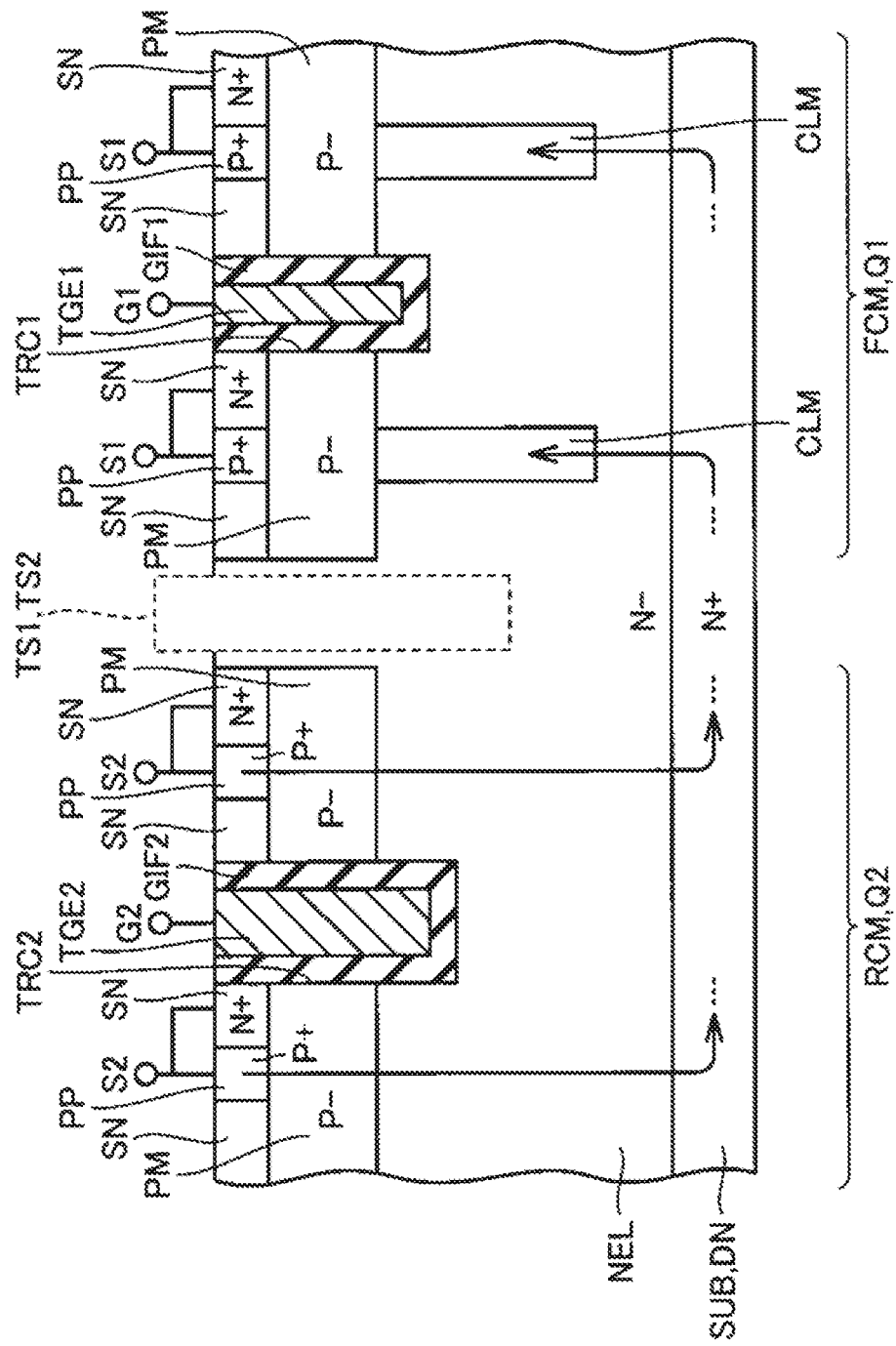
FIG. 20 is a circuit diagram for explaining a flow of current in case of that a breakdown occurs in a semiconductor device where a power supply is properly connected.

In contrast to the semiconductor device according to the comparative examples, in the semiconductor device SDVs described above, the position of the bottom of the first trench gate electrode TGE1 is shallower than the position of the bottom of the second trench gate electrode TGE2. As a result, as shown in FIG. 20, even if the first power MOS transistor Q 1 breaks down, the current flows from the semiconductor substrate SUB to the column CLM. As a result, as compared with the case where the current flows through the first trench gate electrodes CTG1, the characteristic variation of the first power MOS transistor Q 1 due to the variation of the gate capacitance can be suppressed.

It has now been clarified by the inventors that whether the breakdown current flows through the first trench gate electrode TGE1 (CTG1 side or the column CLM (CCLM) side depends on the distances between the first trench gate electrode TGE1 (CTG1) and the column CLM (CCLM), the depth of the first trench gate electrode TGE1 (CTG1), and the dimensions (widths) of the column CLM (CCLM).

According to the evaluation by the inventors, the following findings were obtained. That is, when the distances between the first trench gate electrodes CTG1 and the columns CLMs are relatively short, the current easily flows through the columns. In addition, it has been found that when the first trench gate electrodes TGE1 (first trench TRC1) are relatively shallow, the current easily flows through the columns CLM-side.

Figure 21:
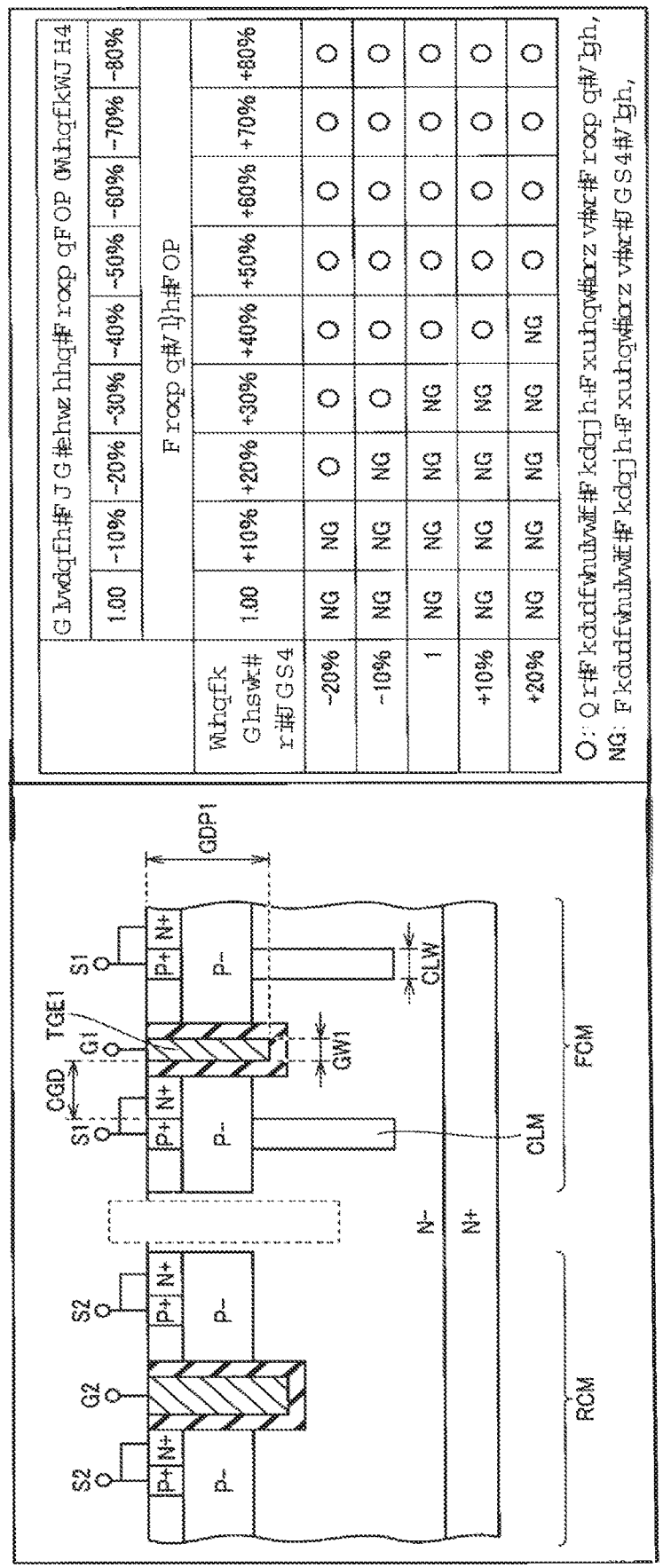
FIG. 21 is a diagram showing the results of a simulation to evaluate the presence or absence of a characteristic variation in case of that a breakdown occurs in the semiconductor device.

Evaluation by simulation of the inventors will be described in detail. As shown in FIG. 21, as the distance (column-trench distance CGD) between the column CLM and the first trench gate electrode TGE1, the nine conditions (1.00 to –80%) were set by setting the width (column dimension CLW) of the column CLM to be wider stepwise (1.00 to +80%) based on the reference distance (1.00).

For each of the column-trench distances CGD (1.00 to –80%), five conditions (–20% to 1% to +20%) were set stepwise as the depth GDP1 of the first trench gate electrodes TGE1 based on the reference depth.

In FIG. 21, the case where the current flows to the column side at the time of breakdown and the characteristic variation does not occur in the first power MOS transistor Q 1 is indicated by "0". On the other hand, the case where the current flows through the trench gate electrode side and there is a possibility that the characteristic variation occurs in the first power MOS transistor Q 1 is indicated by "NG".

As shown in FIG. 21, it is understood that when the column-trench distance CGD is shortened, the current at the time of breakdown easily flows to the column CLM side. Further, it can be seen that as the depth GDP1 (the depth of the first trench) of the first trench gate electrode TGE1 becomes deeper, the current at the time of breakdown easily flows to the column CLM-side.

For example, let us focus on five evaluation results when the distance of the column-trench distance CGD is –30% of the reference value (column dimension+30%). It can be seen from the results that when the depth GDP1 of the first trench gate electrode TGE1 is the reference value, the current flows through the first trench gate electrode TGE1 and the characteristics of the first power MOS transistor Q 1 may fluctuate. On the other hand, when the depth GDP1 of the first trench gate electrodes TGE1 becomes 10% shallower than the reference value, the current flows to the column side, and it is understood that the characteristics of the first power MOS transistor Q 1 do not vary.

Next, attention is paid to five evaluation results when the distance of the column-trench distance CGD is −50% of the reference value (column dimension+50%). As a result of the evaluations, it was found that, for all five conditions including the case where the depth GDP1 of the first trench gate electrodes TGE1 is +20% of the reference value, the current flows to the column side and the characteristics of the first power MOS transistor Q 1 do not vary. However, if the column dimension CLW (width) is made wider than +50% of the reference value, there is a concern that it becomes difficult to obtain a desired junction withstand voltage.

Next, for example, attention is paid to nine evaluations when the depth GDP1 of the first trench gate electrodes TGE1 is −20% of the reference value. As a result of this evaluation, when the distance of the column-trench distance CGD becomes −20% or less of the reference value (column dimension+20% or more), the current flows to the column side, and the characteristic of the first power MOS transistor Q 1 does not vary.

From these evaluation results, the inventors have found that a desired margin for the junction withstand voltage can be ensured while designing such that the current at the time of breakdown flows through the column CLM side.

In the semiconductor device SDVs described above, the first trenches TRC1 and the second trenches TRC2 having different depths are formed in the epitaxial layers NELs. At this time, due to the micro-loading effect, the etching rate of the epitaxial layer NEL at the time of forming the first trench TRC1 having a narrow width becomes lower than the etching rate of the epitaxial layer NEL at the time of forming the second trench TRC2 having a wide width. Thus, the first trench TRC1 and the second trench TRC2 having different depths can be formed in the epitaxial layers NELs by one etching process.

Figure 22:
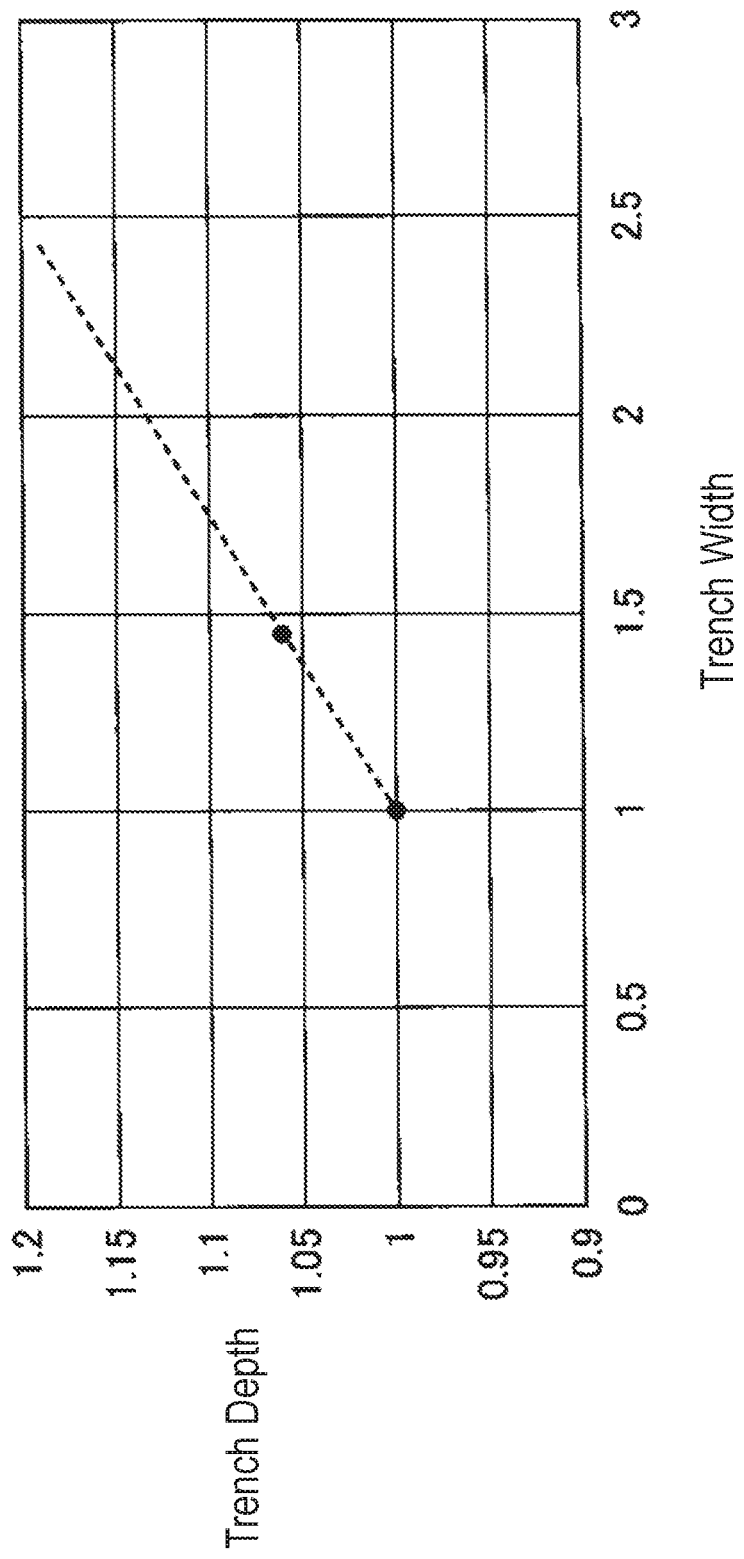
FIG. 22 is a graph showing the relationship between the depth of the trenches and the width of the trenches to explain the micro-loading effect.

Here, the relationship between the trench depth and the trench width performed by the inventors under the same etching conditions is shown as a graph in FIG. 22. The horizontal axis of the graph represents trench width, and the vertical axis of the graph represents trench depth. The graph shows the dependence of trench depth on trench width. As shown in FIG. 22, it can be seen that as the width of the trench becomes narrower, the etching rate decreases and the trench depth becomes shallower.

In the manufacturing method of the above-described semiconductor device, the first trench TRC1 and the second trench TRC2 having different depths can be simultaneously formed in the epitaxial layers NELs by one photolithography process and one etch process by using the micro-loading effect. As a result, the production cost can be reduced.

In the semiconductor device SDV described above, the area of the first element region FCM in which the first power MOS transistor Q 1 is arranged is set larger than the area of the second element region RCM in which the second power MOS transistor Q 2 is arranged.

As described above, the depth GDP1 of the first trench gate electrode TGE1 of the first power MOS transistor Q 1 is shallower than the depth GDP2 of the second trench gate electrode TGE2 of the second power MOS transistor Q 2. Therefore, the on-resistance of the first power MOS transistor Q 1 is higher than the on-resistance of the second power MOS transistor Q 2. The on-resistance depends on the area of the region in which the power MOS transistor is formed, and the larger the area, the lower the on-resistance.

Therefore, by setting the area of the first element region FCM to be larger than the area of the second element region RCM, the on-resistance per unit area of the first power MOS transistor Q 1 can be matched with the on-resistance per unit area of the second power MOS transistor Q 2, thereby contributing to lowering the on-resistance at the time of operation.

In the second embodiment first embodiment, the first trench gate electrode TGE1 is formed in the first element region FCM, and the second trench gate electrode TGE2 is formed in the second element region RCM (see FIGS. 2 to 5).

In the semiconductor device SDVs, the potential of the first trench gate electrode TGE1 and the potential of the second trench gate electrode TGE2 are set to the same potential. Here, an exemplary semiconductor device in which the trench gate wiring electrically connecting the first trench gate electrode TGE1 and the second trench gate electrode TGE2 is disposed between the first element region FCM and the second element region RCM will be described.

Figure 23:
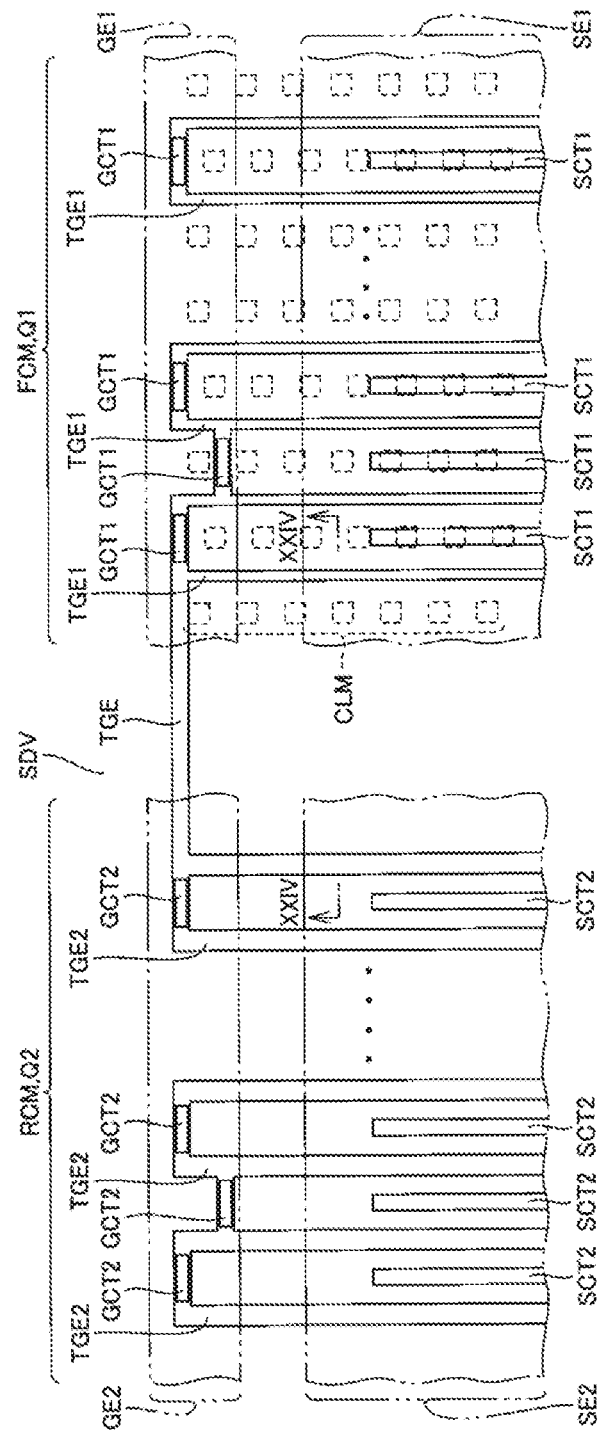
FIG. 23 is a portion enlarged plan view showing the planar structures of a semiconductor device according to a second embodiment.
Figure 24:
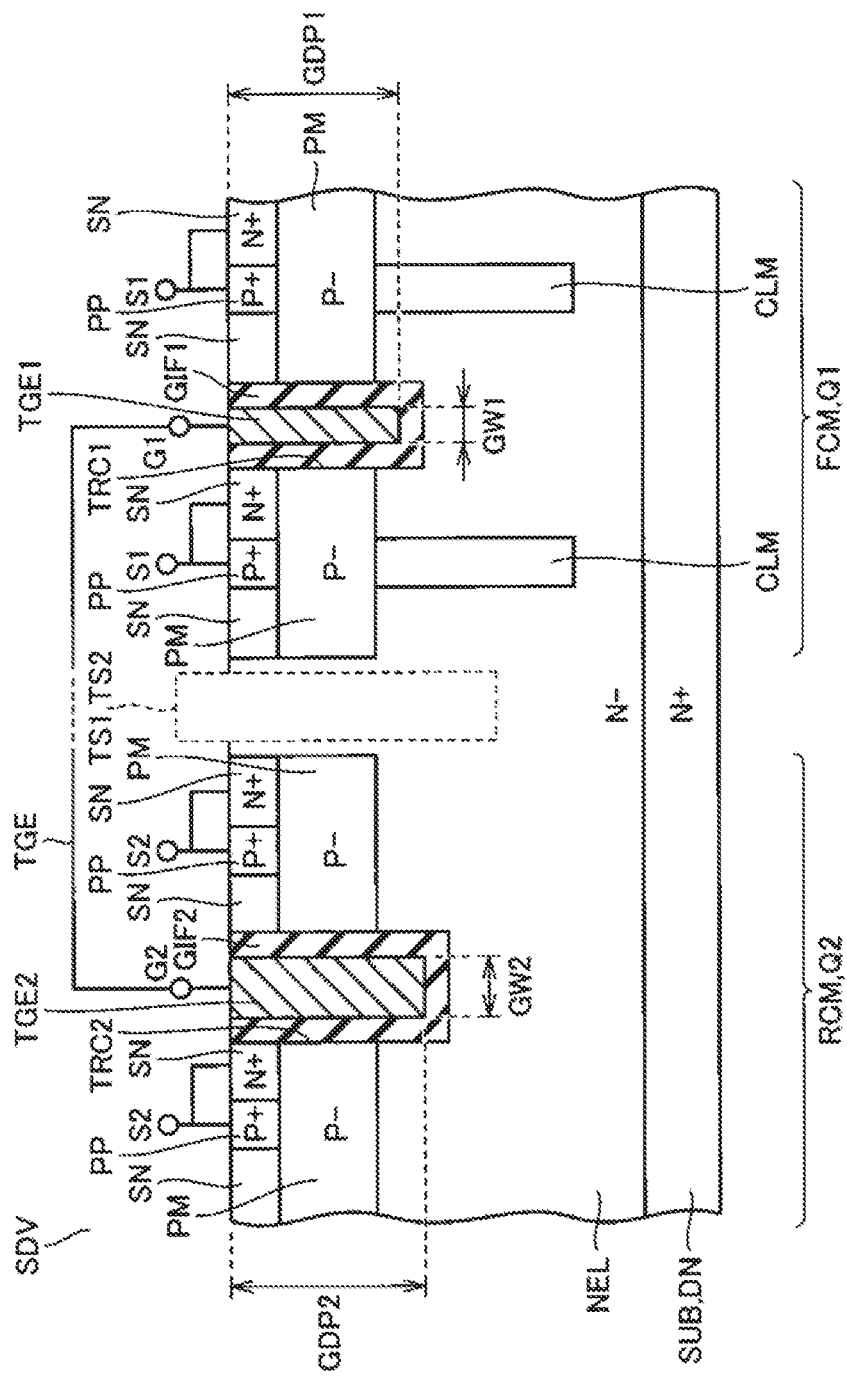
FIG. 24 is a portion cross-sectional view in the cross-sectional line XXIV-XXIV shown in FIG. 23.

As shown in FIGS. 23 and 24, a trench gate wiring TGE is formed between the first element region FCM and the second element region RCM. The first trench gate electrode TGE1 and the second trench gate electrode TGE2 are electrically connected by the trench gate wiring TGE. The position of the bottom of the first trench gate electrode TGE1 is shallower than the position of the bottom of the second trench gate electrode TGE2, and the depth GDP1 of the first trench gate electrode TGE1 is shallower than the depth GDP2 of the second trench gate electrode TGE2. The same reference numerals are assigned to the same components as those of the semiconductor device SDVs shown in FIGS. 3 to 5, and descriptions thereof will not be repeated except when required.

Next, an exemplary manufacturing method of the semiconductor device SDVs described above will be briefly described. In the semiconductor device SDVs described above, patterns for forming trench gates wiring TGEs are added in the steps shown in FIGS. 6 to 8. Thereafter, the semiconductor device SDVs are manufactured through the same steps as those shown in FIGS. 9 to 16.

In the semiconductor device SDVs described above, the depth GDP1 of the first trench gate electrode TGE1 is shallower than the depth GDP2 of the second trench gate electrode TGE2. As a result, even if the first power MOS transistor Q 1 breaks down, the current flows from the semiconductor substrate SUB to the column CLM in the same manner as the semiconductor device SDV described above. As a result, it is possible to suppress the characteristic variation of the first power MOS transistor Q 1 caused by the variation of the gate capacitance.

In the third embodiment first embodiment, the first trench TRC1 and the second trench TRC2 having different depths are simultaneously formed in the epitaxial layers NELs by one photolithography process and one etch process. Here, the first trench TRC1 and the second trench TRC2 having different depths are individually formed.

Figure 25:
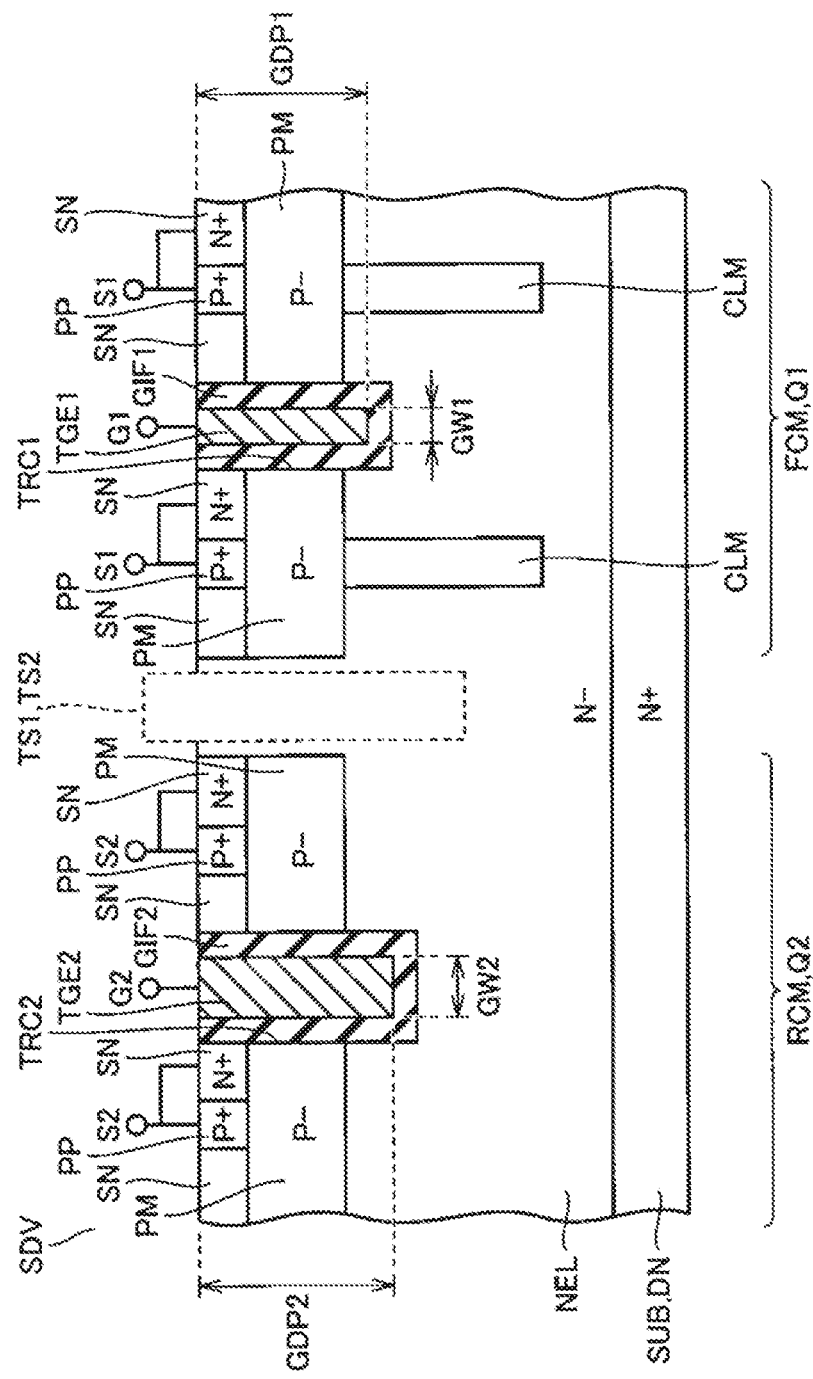
FIG. 25 is a partial cross-sectional view of a semiconductor device according to a third embodiment.

The cross-sectional structure of the semiconductor device according to third embodiment is substantially the same as the cross-sectional structure of the semiconductor device according to first embodiment. As shown in FIG. 25, the position of the bottom of the first trench gate electrode TGE1 is shallower than the position of the bottom of the second trench gate electrode TGE2, and the depth GDP1 of the first trench gate electrode TGE1 is shallower than the depth GDP2 of the second trench gate electrode TGE2. Components identical to those of the semiconductor device SDVs shown in FIGS. 3 to 5 are denoted by the same reference numerals, and descriptions thereof will not be repeated except when required.

Figure 26:
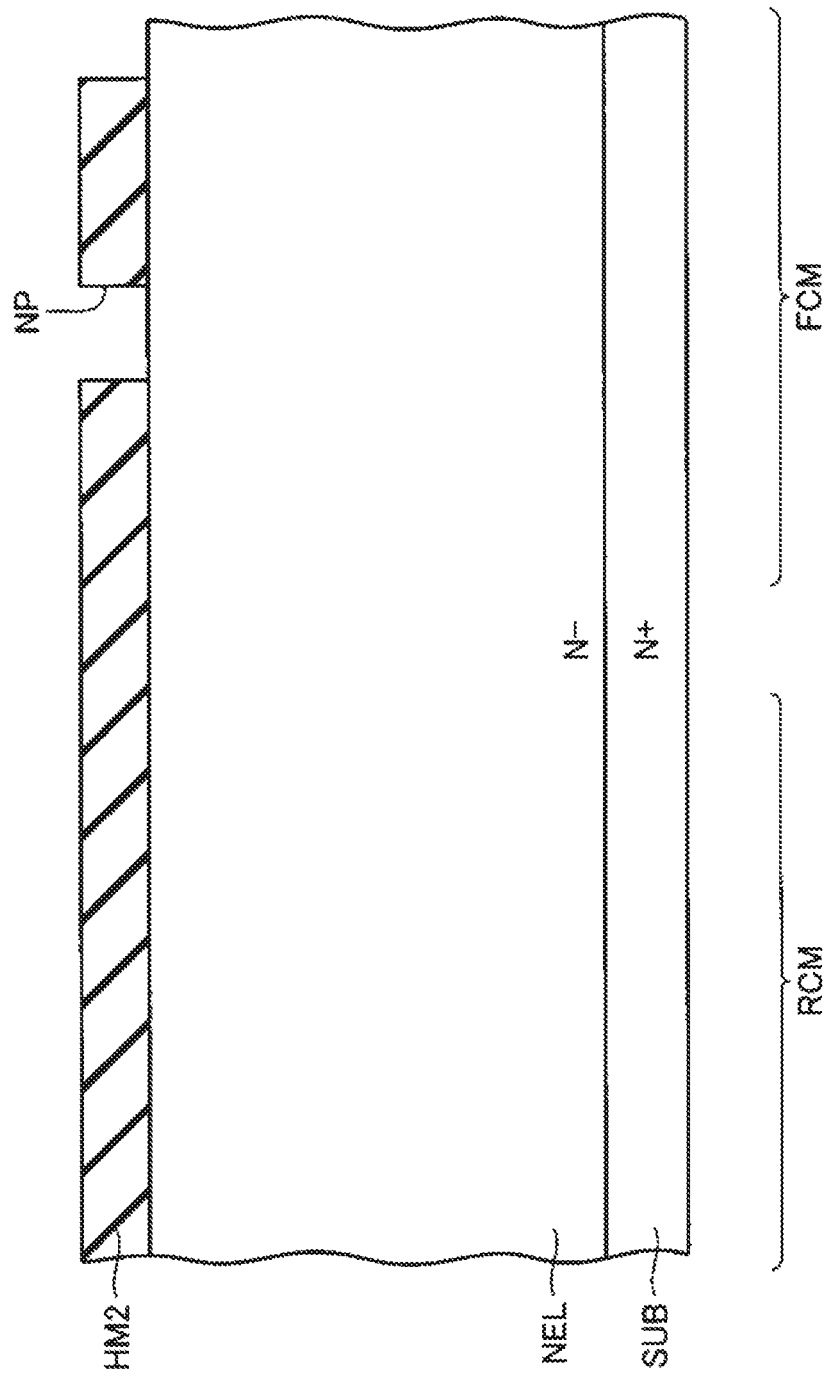
FIG. 26 is a partial cross-sectional view illustrating one step of a method of manufacturing the semiconductor device according to the third embodiment.

Next, an exemplary manufacturing method of the above-described semiconductor device will be described. First, a silicon oxide film HM2 serving as a hard mask is formed so as to cover the epitaxial layers NELs formed on the surfaces of the semiconductor substrate SUBs, as shown in FIG. 26. Next, as shown in FIG. 26, predetermined photolithography and etch processes are performed to form openings NPs in portions of the silicon oxide film HM2 located in the first device regions FCMs. On the other hand, the second device area RCM is covered with the silicon oxide film HM2.

Figure 27:
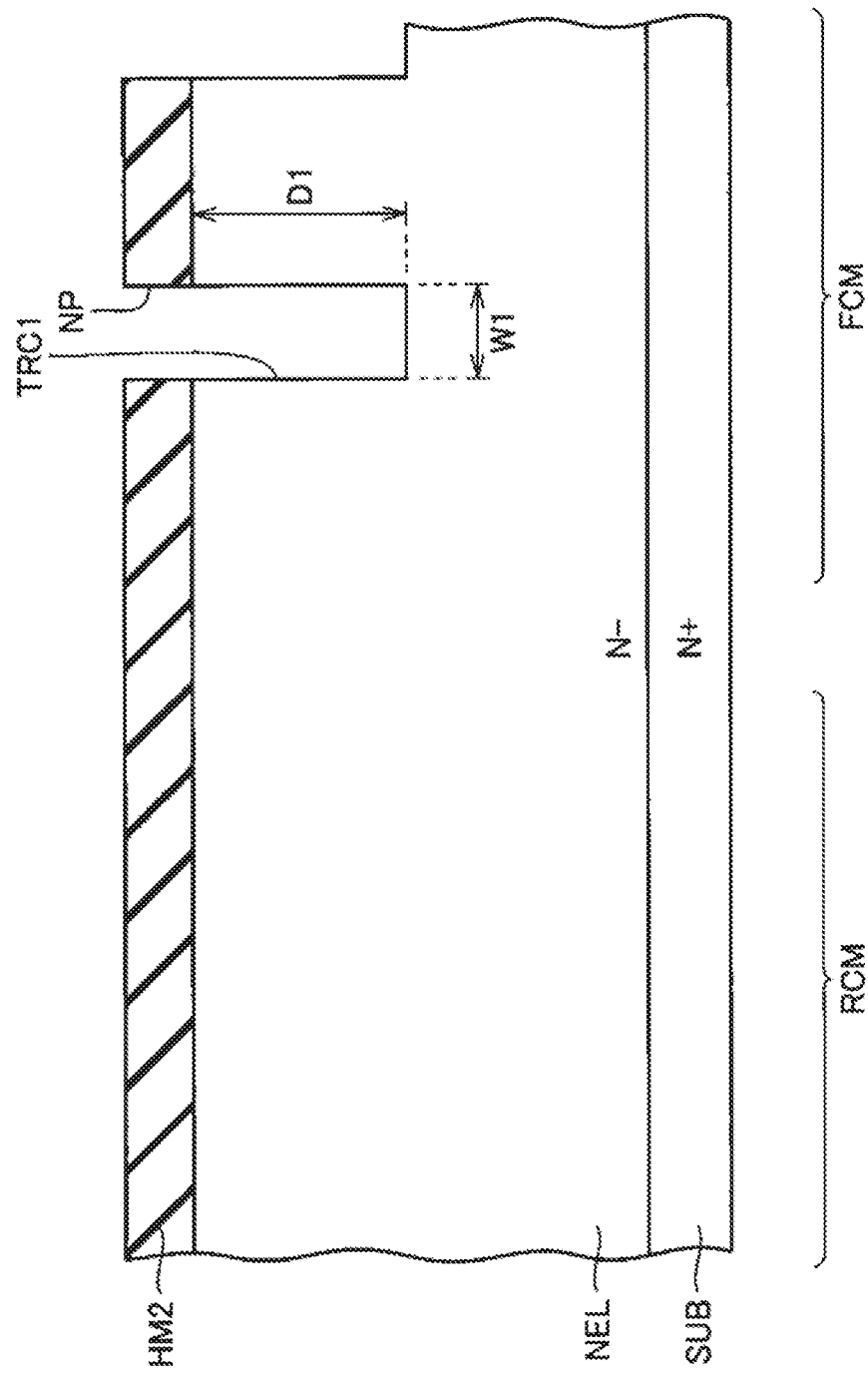
FIG. 27 is a partial cross-sectional view illustrating a step performed after the step shown in FIG. 26.

Next, as shown in FIG. 27, the first trench TRC1 is formed in the first device area FCM by etching the epitaxial layer NEL using the silicon oxide film HM2 as an etching mask. By controlling the etch time, a first trench TRC1 of a predetermined depth D 1 having a width W 1 can be formed. Thereafter, the silicon oxide film HM2 is removed.

Figure 28:
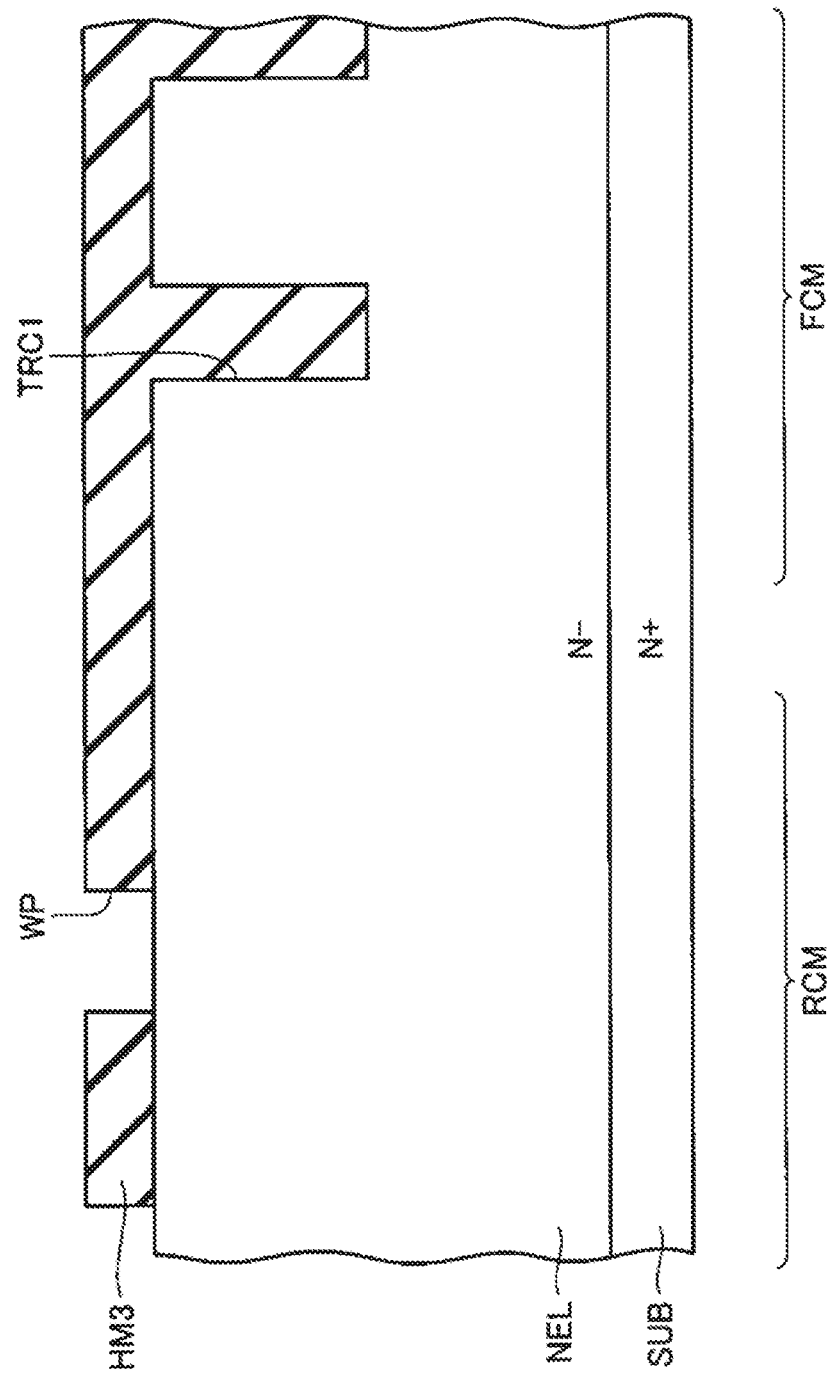
FIG. 28 is a partial cross-sectional view illustrating a step performed after the step shown in FIG. 27.

Next, a silicon oxide film HM3 serving as a hard mask is formed so as to cover the epitaxial layer NEL, as shown in FIG. 28. Next, as shown in FIG. 28, predetermined photolithography and etch processes are performed to form openings WPs in portions of the silicon oxide film HM3 located in the second device regions RCMs. On the other hand, the first device area FCM is covered with the silicon oxide film HM3.

Figure 29:
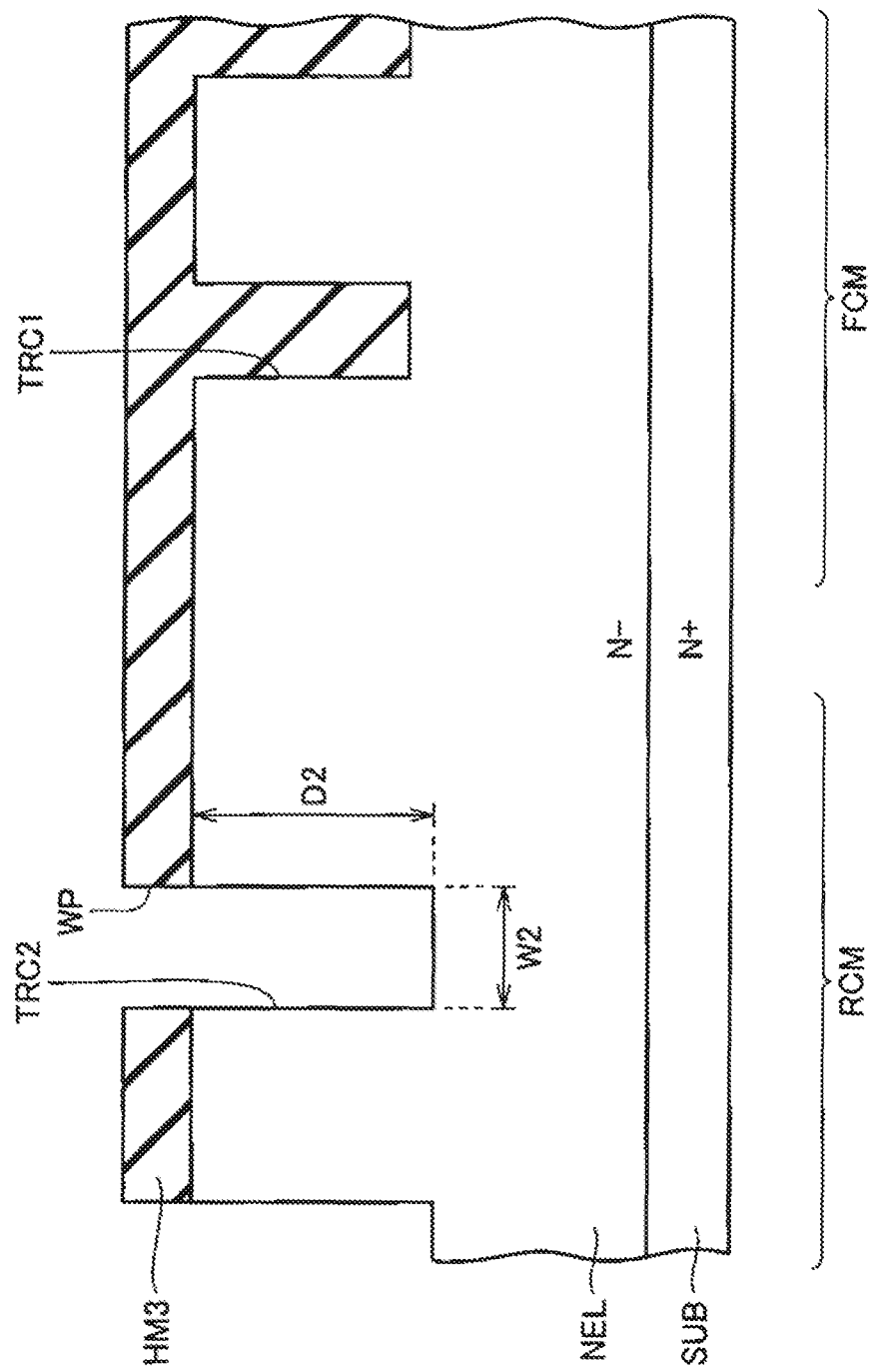
FIG. 29 is a partial cross-sectional view illustrating a step performed after the step shown in FIG. 28.

Next, as shown in FIG. 29, the second trench TRC2 is formed in the second device area RCM by etching the epitaxial layer NEL using the silicon oxide film HM3 as an etching mask. By controlling the etch time, a second trench TRC2 having a width W 2 and a predetermined depth D 2 can be formed. The depth D 2 of the second trench TRC2 is deeper than the depth D 1 of the first trench TRC1. The width W 2 is wider than the width W 1, but is not necessarily required. Thereafter, the silicon oxide film HM3 is removed.

Figure 30:
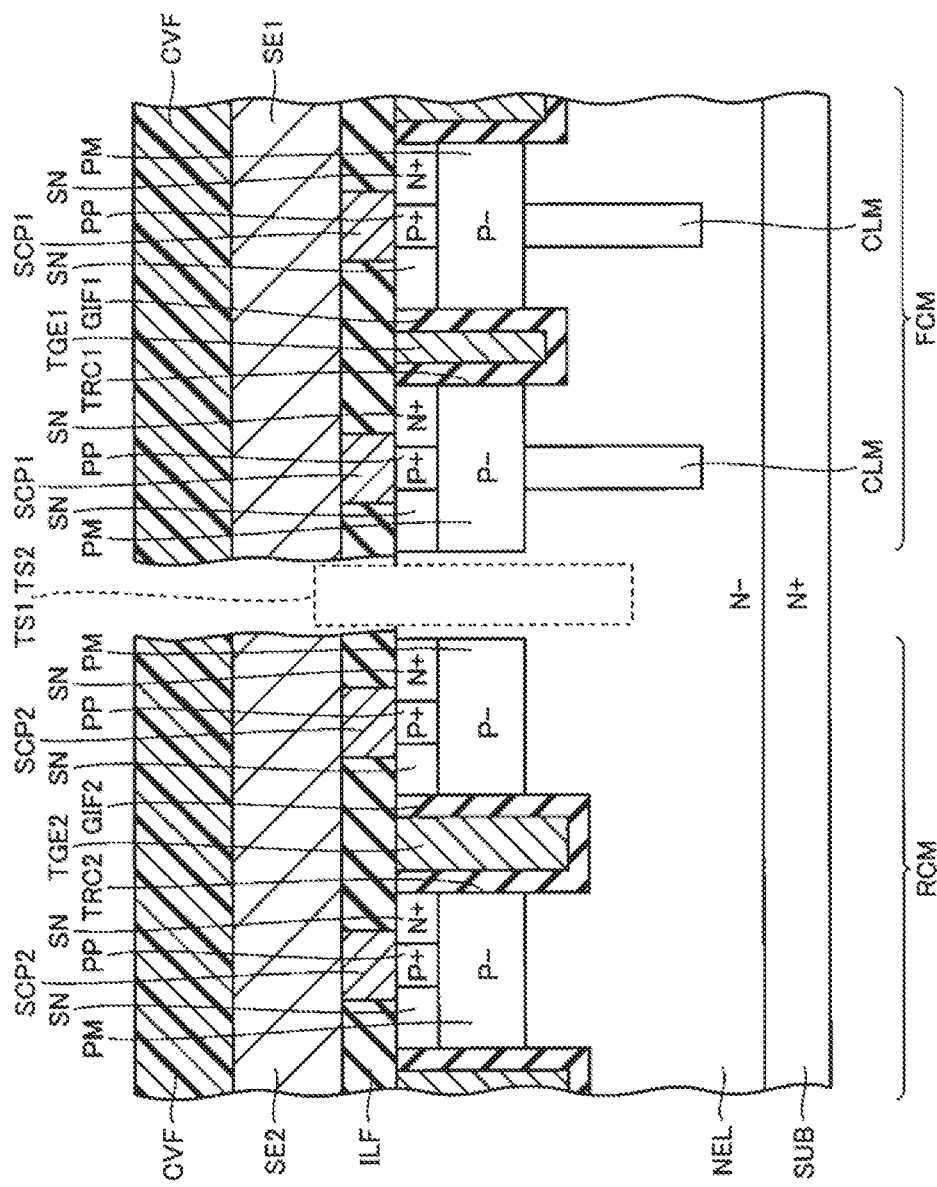
FIG. 30 is a partial cross-sectional view illustrating a step performed after the step shown in FIG. 29.

After the first trench TRC1 and the second trench TRC2 are formed, the covering film CVF is formed as shown in FIG. 30 through the same steps as those shown in FIGS. 9 to 16. Next, the semiconductor device (semiconductor substrate SUB) is taken out as one chip by dicing the semiconductor substrate SUB (wafer). Thereafter, the extracted semiconductor substrate SUB is completed as a semiconductor device through a process of mounting the SUB on a lead frame, not shown, or the like.

In the semiconductor device SDVs described above, the depth GDP1 of the first trench gate electrode TGE1 is shallower than the depth GDP2 of the second trench gate electrode TGE2. As a result, even if the first power MOS transistor Q 1 breaks down, the current flows from the semiconductor substrate SUB to the column CLM in the same manner as the semiconductor device SDV related to the first embodiment. As a result, it is possible to suppress the characteristic variation of the first power MOS transistor Q 1 caused by the variation of the gate capacitance.

In the manufacturing method of the semiconductor device SDVs described above, the first trench TRC1 and the second trench TRC2 having differing depths are formed by respective etch processes. The first trench TRC1 is formed by etching the epitaxial layer NEL using the silicon oxide film HM2 as an etching mask. The second trench TRC2 is formed by etching the epitaxial layer NEL using the silicon oxide film HM3 as an etching mask. Thus, the depths of the first trench TRC1 and the second trench TRC2 can be controlled with high accuracy.

The semiconductor device described in the respective embodiments can be combined in various manners as required.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a semiconductor substrate having i) first region, ii) a second region, and iii) a drain region, the second region being different from the first region such that the first region and the second region are spaced apart from each other, the semiconductor substrate being formed of a first conductivity type;
   a first semiconductor layer formed on the semiconductor substrate, the first semiconductor layer being formed of the first conductive type;
   a first MOS transistor formed in the first region of the semiconductor substrate; and
   a second MOS transistor formed in the second region of the semiconductor substrate,
   wherein the first MOS transistor includes:
      a first trench gate electrode formed so as to be embedded in a first trench formed in the first semiconductor layer via a first gate insulating film;
      a first base region formed of a second semiconductor layer of a second conductivity type opposite to the first conductivity type and located on a side of the first trench;
      a first source region formed of a third semiconductor layer of the first conductive type and formed in the second semiconductor layer; and
      a column region formed of a fourth semiconductor layer of the first conductive layer and formed in a lower portion of the base region,
   wherein the second MOS transistor includes:
      a second trench gate electrode formed so as to be embedded in a second trench formed in the first semiconductor layer via a second gate insulating film;
      a second base region formed of a fifth semiconductor layer of the second conductivity type opposite and located on a side of the second trench; and
      a second source region formed of a sixth semiconductor layer of the first conductive type and formed in the fifth semiconductor layer; and
   wherein a depth of the first trench is shallower than a depth of the second trench in a thickness direction of the semiconductor substrate,
   wherein a width of the first trench gate electrode is narrower than a width of the second trench gate electrode, and
   wherein the first trench gate electrode and the second trench gate electrode are commonly connected by a trench gate wiring.

2. The semiconductor device according to claim 1, wherein a bottom of the column region is formed at a position deeper than a depth of the second trench in the thickness direction of the semiconductor substrate.

3. The semiconductor device according to claim 1, wherein the drain region is a common drain region of the first and second MOS transistors.

4. The semiconductor device according to claim 3, wherein source-drain paths of the first and second MOS transistors are connected in series between an external power supply and a load.

\* \* \* \* \*